(12) United States Patent
Iwata et al.

(10) Patent No.: US 7,385,848 B2
(45) Date of Patent: Jun. 10, 2008

(54) SEMICONDUCTOR STORAGE DEVICE AND ELECTRONIC EQUIPMENT

(75) Inventors: Hiroshi Iwata, Nara-ken (JP); Yoshiji Ohta, Kashiwara (JP)

(73) Assignee: Sharp Kabushiki Kaisha, Osaka (JP)

( * ) Notice: Subject to any disclaimer, the term of this patent is extended or adjusted under 35 U.S.C. 154(b) by 90 days.

(21) Appl. No.: 11/516,642

(22) Filed: Sep. 7, 2006

(65) Prior Publication Data

US 2007/0076499 A1    Apr. 5, 2007

(30) Foreign Application Priority Data

Sep. 9, 2005 (JP) ............................ P2005-261959
Oct. 3, 2005 (JP) ............................ P2005-289948

(51) Int. Cl.
*G11C 11/34* (2006.01)
(52) U.S. Cl. ........................... 365/185.21; 365/185.03; 365/185.25
(58) Field of Classification Search ........... 365/185.21, 365/185.03, 185.25
See application file for complete search history.

(56) References Cited

U.S. PATENT DOCUMENTS 6,747,892 B2 * 6/2004 Khalid .................. 365/185.21

6,912,160 B2    6/2005 Yamada

FOREIGN PATENT DOCUMENTS

JP    2004-273093 A    9/2004

* cited by examiner

*Primary Examiner*—Huan Hoang
(74) *Attorney, Agent, or Firm*—Birch, Stewart, Kolasch & Birch, LLP

(57) ABSTRACT

A semiconductor storage device has a memory cell array composed of a plurality of arrayed memory cells, word lines, bit lines, a bit line charging and discharging circuit, and a readout section. Each memory cell has two storage regions in vicinity of opposite ends of a channel region, first and second input/output terminals, and a control terminal. The readout section reads information stored in one of the first and second storage regions of a memory cell based on a first output equivalent to an output current from the memory cell when a current is passed from the first input/output terminal to the second input/output terminal of the memory cell and a second output equivalent to an output current from the memory cell when a current is passed from the second input/output terminal to the first input/output terminal.

19 Claims, 23 Drawing Sheets

SEMICONDUCTOR STORAGE DEVICE AND ELECTRONIC EQUIPMENT

This nonprovisional application claims priority under 35 U.S.C. §119(a) on Patent Application Nos. 2005-261959 and 2005-289948-filed in Japan on Sep. 9, 2005 and Oct. 3, 2005, respectively, the entire contents of which are hereby incorporated by reference.

The present invention relates to a semiconductor storage device and more particularly to a semiconductor storage device having a nonvolatile memory cells such as flash memory cells and mask ROM (Read Only Memory) cells having a function to allow independent storage in the vicinity of both ends of one channel region. The present invention also relates to electronic equipment having the semiconductor storage device.

In recent years, as semiconductor storage devices for data storage in equipment such as portable phones and digital cameras or as semiconductor storage devices for code (program) storage, nonvolatile semiconductor storage devices such as flash memories, ferroelectric memories and mask ROMs are widely used. In order to increase the storage capacity per unit area and decrease the cost per bit, the storage scheme is rapidly changing from a binary scheme to a multilevel scheme.

In the case of such nonvolatile memory cells, of which information stored is determined by using change in cell currents (currents flowing in memory cells) corresponding to storage states, it is difficult to impart an identical cell current to a plurality of memory cells that store identical information, because of the structure of the memory cells. Consequently, it is a common occurrence that a plurality of memory cells storing identical information have distributions of cell current values varied in a certain range. However, if the distributions of cell current values overlap among a plurality of memory cells storing different information, it becomes difficult to determine correct information. Accordingly, among the memory cells storing different information, adjustment is implemented by program verify operation so that the cell current distributions do not overlap each other, i.e., an interval is generated between respective distributions. However, there is a problem that the recent progress of miniaturization, low-voltage structure, multi-value processing and the like is narrowing an interval between the cell current distributions. Particularly in memories, such as sidewall memories, having a plurality of storage nodes (storage regions) in one memory cell for increasing the integration degree, there are two storage nodes allowing independent storage in the vicinity of both ends of one channel region, and therefore a cell current of one storage node is influenced by the state of the opposite storage node, i.e., when one storage node is read, the cell current thereof is influenced by the other storage node. Further, the influence of disturb (disturbance caused by access to other memory cells), endurance (deterioration of rewrite characteristics of memory cells due to increase in number of times of rewrite), and/or retention (retaining characteristics of stored information against temperature change and change with time) and the like is exerted over a plurality of memory cells to various degrees. Consequently, the distributions of cell current values in respective memory cells are widely spread, and an interval for distancing the distributions of cell current values of data 0 and data 1 from each other is extremely narrowed or the distributions are overlapped with each other, thereby causing a problem of inability to distinguish between data 0 and data 1.

There is a semiconductor storage device using a typical method for conventional read operation in which reference cells are provided and a cell current value of a readout target memory cell is compared with current values or an average current value of the reference cells for information determination (see JP 2004-273093 A and its corresponding U.S. Pat. No. 6,912,160 B2). More specifically, data 0 and data 1 are stored in advance in two reference cells, and an average current value of these reference cells are used as a reference current value.

However, in the conventional semiconductor storage device, when an interval between the distributions of data 0 and data 1 is extremely narrow or the distributions overlap each other (the interval disappears), it was impossible to correctly read memory cell information.

SUMMARY OF THE INVENTION

An object of the present invention is to provide a semiconductor storage device capable of determining memory cell information with high accuracy even when an interval between distributions of cell current values of data 0 and data 1 are extremely narrow or the distributions overlap each other.

In order to accomplish the above object, there is provided a semiconductor storage device according to one aspect of the present invention, that includes:

a memory cell array composed of a plurality of arrayed memory cells, each memory cell having a first storage region capable of storing information in vicinity of one of opposite ends of a channel region, a second storage region capable of storing information in vicinity of the other end of the channel region, a first input/output terminal, a second input/output terminal, and a control terminal;

word lines connected to the control terminals of the memory cells;

bit lines connected to the first input/output terminals and/or the second input/output terminals of the memory cells;

a bit line charging and discharging circuit for charging or discharging the bit lines; and a readout section for reading information stored in the first storage region of a memory cell based on a first output equivalent to an output current from the memory cell when a current is passed from the first input/output terminal to the second input/output terminal of the memory cell and a second output equivalent to an output current from the memory cell when a current is passed from the second input/output terminal to the first input/output terminal.

According to the present invention, in each memory cell having two storage regions (storage nodes) allowing independent storage in the vicinity of both the opposite ends of one channel region, information stored in the first storage region is read based on the first output and the second output, so that in each memory cell, it becomes possible to detect the state in which data 1 is stored in the first storage region while data 0 is stored in the second storage region and the state in which data 0 is stored in the first storage region while data 1 is stored in the second storage region. Therefore, whether the first storage region stores data 1 or data 0 can correctly be determined.

More specifically, there is a phenomenon that a cell current value of one storage node influences the state of the opposite storage node, i.e., a phenomenon that when information stored in the first storage region is read out, the read operation is influenced by the information stored in the second storage region, or a phenomenon that regarding the distributions of cell currents in a plurality of memory cells, an interval between a distribution in the state in which data 1 is stored in the first storage region while data 0 is stored in the second storage region and a distribution in the state in which data 0 is stored in the first storage region and data 1 is stored in the second storage region is narrowed or the distributions are overlapped due to the influence of disturb (disturbance caused by access to other memory cells), endurance (deterioration of rewrite characteristics of memory cells due to increase in number of times of rewrite), retention (retaining characteristics of stored information against temperature change and change with time) and the like. However, performing comparison between the first output and the second output makes it possible to distinguish between the state in which data 1 is stored in the first storage region while data 0 is stored in the second storage region and the state in which data 0 is stored in the first storage region while data 1 is stored in the second storage region. Therefore, whether the first storage region stores data 1 or data 0 can correctly be determined, and this allows determination of memory cell information with high accuracy.

In one embodiment, the readout section includes:

a first sense amplifier for comparing the first output with a first reference value which can distinguish between a state in which data 1 is stored in the first storage region while data 1 is stored in the second storage region and a state in which data 0 is stored in the first storage region while data 1 is stored in the second storage region;

a second sense amplifier for comparing the first output with a second reference value which can distinguish between a state in which data 1 is stored in the first storage region while data 0 is stored in the second storage region and a state in which data 0 is stored in the first storage region while data 0 is stored in the second storage region;

a third sense amplifier for comparing the first output with the second output; and a majority logic circuit connected to an output terminal of the first sense amplifier, an output terminal of the second sense amplifier and an output terminal of the third sense amplifier.

According to the embodiment, the output terminal of the first sense amplifier, the output terminal of the second sense amplifier and the output terminal of the third sense amplifier are connected to the majority logic circuit for providing a majority decision regarding binary outputs from the first to the third sense amplifiers, so that information stored in the first storage region can correctly be read. In other words, in the present embodiment, in the state in which data 1 is stored in the first storage region while data 1 is stored in the second storage region or in the state in which data 1 is stored in the first storage region while data 0 is stored in the second storage region, the output from the majority logic circuit can be made 1, whereas in the state in which data 0 is stored in the first storage region while data 1 is stored in the second storage region or in the state in which data 0 is stored in the first storage region while data 0 is stored in the second storage region, the output from the majority logic circuit can be made 0. Therefore, information stored in the first storage region can correctly be read out by just detecting the output from the majority logic circuit.

In one embodiment, the first output is a potential of the bit line connected to the first input/output terminal, and the second output is a potential of the bit line connected to the second input/output terminal, and the semiconductor storage device includes:

a first capacitor for storing electric charge equivalent to a potential difference between the first output and a first reference potential, the first capacitor having two electrodes;

a second capacitor for storing electric charge equivalent to a potential difference between the first output and the second output, the second capacitor having two electrodes;

a switching section for connecting and disconnecting a first reference potential-side electrode of the first capacitor and a second output-side electrode of the second capacitor; and a sense amplifier for receiving a potential difference between the electrodes of the first capacitor or a potential difference between the electrodes of the second capacitor.

In one embodiment, the first output is a potential of the bit line connected to the first input/output terminal, and the second output is a potential of the bit line connected to the second input/output terminal, and the semiconductor storage device includes:

a first capacitor for storing electric charge equivalent to a potential difference between the first output and a first reference potential, the first capacitor having two electrodes;

a second capacitor for storing electric charge equivalent to a potential difference between the first output and a second reference potential, the second capacitor having two electrodes;

a third capacitor for storing electric charge equivalent to a potential difference between the first output and the second output, the third capacitor having two electrodes;

a switching section for connecting and disconnecting a first reference potential-side electrode of the first capacitor, a second reference potential-side electrode of the second capacitor, and a second output-side electrode of the third capacitor; and a sense amplifier for receiving a potential difference between the electrodes of the first capacitor, a potential difference between the electrodes of the second capacitor, or a potential difference between the electrodes of the third capacitor.

In one embodiment, the first output is a potential of the bit line connected to the first input/output terminal, and the second output is a potential of the bit line connected to the second input/output terminal, and the semiconductor storage device includes:

a first capacitor for storing electric charge equivalent to a potential difference between the first output and a first reference potential;

a second capacitor for storing electric charge equivalent to a potential difference between the first output and a ground;

a third capacitor for storing electric charge equivalent to a potential difference between the second output and the ground;

a switching section for connecting and disconnecting a first reference potential-side electrode of the first capacitor and a counter ground-side electrode of the third capacitor; and a sense amplifier for comparing a potential at a counter ground-side electrode of the second capacitor and a potential at the counter ground-side electrode of the third capacitor.

In one embodiment, the first output is a potential of the bit line connected to the first input/output terminal, and the second output is a potential of the bit line connected to the second input/output terminal, and the semiconductor storage device includes:

a first capacitor for storing electric charge equivalent to a potential difference between the first output and a first reference potential;

a second capacitor for storing electric charge equivalent to a potential difference between the first output and a second reference potential;

a third capacitor for storing electric charge equivalent to a potential difference between the first output and a ground;

a fourth capacitor for storing electric charge equivalent to a potential difference between the second output and the ground;

a switching section for connecting and disconnecting a first reference potential-side electrode of the first capacitor, a second reference potential-side electrode of the second capacitor and a counter ground-side electrode of the fourth capacitor; and a sense amplifier for comparing a potential at a counter ground-side electrode of the third capacitor and a potential at the counter ground-side electrode of the fourth capacitor.

In one embodiment, the first output is a potential of the bit line connected to the first input/output terminal, and the second output is a potential of the bit line connected to the second input/output terminal, and the semiconductor storage device includes:

a first capacitor and a second capacitor; and a switching circuit for switching between connection and disconnection of the first capacitor and the second capacitor such that electric charge equivalent to a potential difference between the first output and a first reference potential is stored in the first capacitor, that electric charge equivalent to a potential difference between the first output and the second output is stored in the second capacitor, that the first capacitor and the second capacitor are connected in parallel, and that a potential difference corresponding to a sum of the electric charge equivalent to the potential difference between the first output and the first reference potential stored in the first capacitor and the charge equivalent to the potential difference between the first output and the second output stored in the second capacitor is outputted to a sense amplifier.

In one embodiment, the first output is a potential of the bit line connected to the first input/output terminal, and the second output is a potential of the bit line connected to the second input/output terminal, and the semiconductor storage device includes:

a first capacitor, a second capacitor, and a third capacitor; and a switching circuit for switching between connection and disconnection of the first capacitor, the second capacitor and the third capacitor so that electric charge equivalent to a potential difference between the first output and a first reference potential is stored in the first capacitor, electric charge equivalent to a potential difference between the first output and a second reference potential is stored in the second capacitor, electric charge equivalent to a potential difference between the first output and the second putout is stored in the third capacitor, that the first capacitor, the second capacitor and the third capacitor are connected in parallel, and that a potential difference corresponding to a sum of the charge equivalent to the potential difference between the first output and the first reference potential stored in the first capacitor, the charge equivalent to the potential difference between the first output and the second reference potential stored in the second capacitor and the charge equivalent to the potential difference between the first output and the second putout stored in the third capacitor is outputted to a sense amplifier.

In one embodiment, the first output is a potential of the bit line connected to the first input/output terminal, and the second output is a potential of the bit line connected to the second input/output terminal, and the semiconductor storage device includes:

a first capacitor, a second capacitor, a third capacitor; and a switching circuit for switching between connection and disconnection of the first capacitor, the second capacitor and the third capacitor so that electric charge equivalent to a potential difference between the first output and a first reference potential is stored in the first capacitor, that electric charge equivalent to a potential difference between the first output and a ground is stored in the second capacitor, that electric charge equivalent to a potential difference between the second output and the ground is stored in the third capacitor, that the first capacitor, the second capacitor and the third capacitor are connected in parallel, and that a potential difference corresponding to a sum of the charge equivalent to the potential difference between the first output and the first reference potential stored in the first capacitor, the charge equivalent to the potential difference between the first output and the ground stored in the second capacitor and the charge equivalent to the potential difference between the second output and the ground stored in the third capacitor is outputted to a sense amplifier.

In one embodiment, the first output is a potential of the bit line connected to the first input/output terminal, and the second output is a potential of the bit line connected to the second input/output terminal, and the semiconductor storage device includes:

a first capacitor, a second capacitor, a third capacitor, and a fourth capacitor; and a switching circuit for switching between connection and disconnection of the first capacitor, the second capacitor, the third capacitor and the fourth capacitor so that electric charge equivalent to a potential difference between the first output and a first reference potential is stored in the first capacitor, that electric charge equivalent to a potential difference between the first output and a second reference potential is stored in the second capacitor, that electric charge equivalent to a potential difference between the first output and a ground is stored in the third capacitor, that electric charge equivalent to a potential difference between the second output and the ground is stored in the fourth capacitor, that the first capacitor, the second capacitor, the third capacitor and the fourth capacitor are connected in parallel, and that a potential difference corresponding to a sum of the charge equivalent to the potential difference between the first output and the first reference potential stored in the first capacitor, the charge equivalent to the potential difference between the first output and the second reference potential stored in the second capacitor, the charge equivalent to the potential difference between the first output and the ground stored in the third capacitor, and the charge equivalent to the potential difference between the second output and the ground stored in the fourth capacitor is outputted to a sense amplifier.

It is to be noted that the term "capacitor" used in the present invention refers to any capacitive device capable of storing charges. For example, the capacitor may be a diode, a capacitive element parasitic on devices (including terminals), of which the capacitance is a parasitic capacitance, and so on.

In each of the above eight embodiments, appropriate setting of the capacitances of each capacitor and the reference potentials allows correct readout of information in the first storage region.

According to the eight embodiments, since the first output is a potential of a bit line connected to the first input/output terminal, and the second output is a potential of a bit line connected to the second input/output terminal, it is easy to compare the case where a current is passed from the first input/output terminal to the second input/output terminal with the case where a current is passed from the second input/output terminal to the first input/output terminal.

According to the eight embodiments, an output current from a memory cell is converted to a potential signal, which is further converted to a charge signal with use of the capacitor, so that the output current (current signal) which cannot be retained can be stored in the capacitor as a charge signal. This makes it possible to compare two current signals different in terms of time.

According to the eight embodiments, compared to the embodiment having a majority logic circuit, the majority logic circuit can be omitted and the number of sense amplifiers can be reduced from three to one, which allows implementation of the same operation with smaller circuitry. Because the number of the sense amplifiers can be reduced from three to one, the number of times of amplification can be reduced from three times to one time, which makes it possible to decrease error caused by the amplification and thereby allows more correct readout of information from the first storage region.

According to the eight embodiments, compared to the embodiment using a majority logic circuit, requirements or conditions to be satisfied by each reference potential can be relaxed.

In one embodiment, the memory cells are sidewall memories.

The "sidewall memory" is herein defined as a memory which has a source region, a drain region, a channel region formed between the source region and the drain region, a gate formed on the channel region, and charge retention regions formed on opposite sides of the gate, and which can store binary or more-valued information by controlling the potentials of the source region, the drain region and the gate so as to separately control the retention states of the charges in these two charge retention regions.

Since a memory cell consisting of a sidewall memory has two storage sections, the integration degree of the semiconductor storage device can effectively be enhanced. In the sidewall memory having two storage regions, the current for reading information in one storage region (storage section) is influenced by the storage state of the other storage region. Therefore, the sidewall memory has a characteristic in which cell current values vary in a wide range compared to the memory cell having one storage section. However, since the semiconductor storage device compares the first output and the second output, information in the memory cell can be determined with high accuracy even when the position of an interval between the distributions of cell current values of all memory cells selected by one word line for data 0 and data 1 is varied from device to device, the position of the interval is displaced with time, or the distributions are overlapped.

A semiconductor storage device in one embodiment includes:

a memory cell array composed of a plurality of arrayed nonvolatile memory cells;

word lines connected to control terminals of the memory cells;

bit lines connected to input/output terminals of the memory cells;

a row selecting circuit for selecting the word line connected to a memory cell from which information is to be read;

a bit line charging and discharging circuit for charging or discharging the bit lines; and a sense amplifier connected to the bit lines for comparing potentials of the bit lines with a reference value, wherein information stored in the memory cell is read out by using both a first potential obtained by charging or discharging a first bit line on one side of the memory cell or a second bit line on the other side of the memory cell when the first bit line is set to have a higher potential than the second bit line and a second potential obtained by charging or discharging the second or the first bit line when the second bit line is set to have a higher potential than the first bit line.

In this embodiment, the first output can be set as a potential of the first or the second bit line gained by charging or discharging in the case where the first bit line on one side of each memory cell is set to have a higher potential than the second bit line on the other side, while the second output can be set as a potential of the second or the first bit line gained by charging or discharging in the case where the second bit line is set to have a higher potential than the first bit line. In this case, when the first output is a potential of the first bit line, the second output is a potential of the second bit line. When the first output is an output obtained by charging, the second output is also an output obtained by charging, whereas when the first output is an output by discharging, then the second output is also an output obtained by discharging.

There is provided, according to another aspect of the present invention, a semiconductor storage device, which includes:

a memory cell array composed of a plurality of arrayed memory cells, each memory cell having a first storage region capable of storing information in vicinity of one of opposite ends of a channel region, a second storage region capable of storing information in vicinity of the other end of the channel region, a first input/output terminal provided on the one end side of the channel region, and a second input/output terminal provided on the other end side of the channel region, each of the memory cells storing 1-bit information by taking a first state or a second state which are distinguished from each other, the first state being a state in which a current flowing from the first input/output terminal to the second input/output terminal is larger than a current flowing from the second input/output terminal to the first input/output terminal, while the second state being a state in which current flowing from the second input/output terminal to the first input/output terminal is larger than a current flowing from the first input/output terminal to the second input/output terminal; and a readout section for reading information stored in a memory cell by comparing a first output corresponding to an output current from the memory cell when a current is passed from the first input/output terminal to the second input/output terminal of the memory cell with a second output corresponding to an output current from the memory cell when a current is passed from the second input/output terminal to the first input/output terminal.

According to the present invention, each of the memory cells takes either the first state or the second state to store 1-bit information, and the first state and the second state can be determined by passing a current from the first input/output terminal to the second input/output terminal and by passing a current from the second input/output terminal to the first input/output terminal. Consequently, even if there is not a sufficient interval between current distributions obtained when a current is passed through a plurality of memory cells having two storage nodes from the first input/output terminal to the second input/output terminal and also from the second input/output terminal to the first input/output terminal, or those two current distributions are overlapped due to the influence of disturb (disturbance caused by access to other memory cells), endurance (deterioration of rewrite characteristics of memory cells due to increase in number of times of rewrite), retention (retaining characteristics of stored information against temperature change and change with time) and the like, still it is possible to correctly read information stored in the memory cells just by passing a current from the first input/output terminal to the second input/output terminal and passing a current from the second input/output terminal to the first input/output terminal. Moreover, according to the present invention, each memory cell itself functions as a reference cell so that it is not necessary to refer to the reference cell every time information in the memory cells is attempted to be read out, and therefore a problem of read disturb will not occur.

In one embodiment, the first state is a state in which the first storage region is in a programmed state (i.e., a state with electrons injected) while the second storage region is in an erased state (i.e., a state with electrons extracted), whereas the second state is a state in which the first storage region is in the erased state while the second storage region is in the programmed state. Consequently, in the first state, an output currents from a memory cell when a current is passed from the first input/output terminal to the second input/output terminal becomes smaller than an output current from the memory cell when a current is passed from the second input/output terminal to the first input/output terminal, whereas in the second state, an output current from a memory cell when a current is passed from the first input/output terminal to the second input/output terminal becomes larger than an output current from the memory cell when a current is passed from the second input/output terminal to the first input/output terminal. Therefore, by comparing a current flowing from the first input/output terminal to the second input/output terminal and a current flowing from the second input/output terminal to the first input/output terminal in each memory cell, information stored in each memory cell can be read out correctly and easily.

In one embodiment, the memory cell has an asymmetric characteristic so that with both the first storage region and the second storage region in an erased state, a current flowing from the first input/output terminal to the second input/output terminal is larger than a current flowing from the second input/output terminal to the first input/output terminal, and the first state is a state in which the first storage region and the second storage region are in the erased state, and the second state is a state in which the first storage region is in a programmed state while the second region is in the erased state.

According to the embodiment, in the first state, an output current from a memory cell when a current is passed from the first input/output terminal to the second input/output terminal is larger than an output current from the memory cell when a current is passed from the second input/output terminal to the first input/output terminal, whereas in the second state, an output current from the memory cell when a current is passed from the first input/output terminal to the second input/output terminal becomes smaller than an output current from the memory cell when a current is passed from the second input/output terminal to the first input/output terminal. Therefore, even if there is not a sufficient interval between current distributions obtained when a current is passed through a plurality of memory cells from the first input/output terminal to the second input/output terminal and also from the second input/output terminal to the first input/output terminal, or those two current distributions are overlapped due to the influence of disturb (disturbance caused by access to other memory cells), endurance (deterioration of rewrite characteristics of memory cells due to increase in number of times of rewrite), retention (retaining characteristics of stored information against temperature change and change with time) and the like, still it is possible to correctly determine information stored in the memory cells just by comparing the first output corresponding to an output current when a current is passed from the first input/output terminal to the second input/output terminal with the second output corresponding to an output current when a current is passed from the second input/output terminal to the first input/output terminal. Moreover, in the state that programmed information is stored in neither of two storage nodes, the size of cell currents is set asymmetric with respect to the direction of a current flow, so that in flash memories in which erasing is performed only per block, additional write operation per bit can easily be implemented.

In one embodiment, the semiconductor storage device includes:

bit lines connected to the first input/output terminals and/or the second input/output terminals of the memory cells; and a bit line charging and discharging circuit for charging or discharging the bit lines, wherein the first output is a potential of the bit line connected to the first input/output terminal, and the second output is a potential of the bit line connected to the second input/output terminal, and wherein the readout section comprises a sense amplifier for comparing the first output with the second output.

According to the embodiment, the semiconductor storage device has a sense amplifier which compares the first output with the second output, so that the information stored in each memory cell can correctly be read out just by comparing the first output with the second output by the sense amplifier without referring to a reference voltage. More specifically, even if the absolute value of a memory cell current is changed by the influence of disturb, endurance, retention and the like, a sign (positive or negative) of a value representing a difference between an output current flowing from the first input/output terminal to the second input/output terminal and an output current flowing from the second input/output terminal to the first input/output terminal hardly changes, so that the information stored in each memory cell can correctly be read out just by comparing the first output and the second output by the sense amplifier without referring to a reference voltage. This eliminates the necessity of providing a reference voltage generating circuit or a reference cell array, and a circuit for changing values of reference voltages or values of currents of the reference cells in response to changes of memory cells with time, thereby allowing drastic simplification of the circuit structure.

In one embodiment, the semiconductor storage device includes:

a first capacitor for storing electric charge equivalent to a potential difference between the first output and the ground; and a second capacitor for storing electric charge equivalent to a potential difference between the second output and the ground, wherein a potential difference between a potential of the first capacitor at a side opposite from the ground and a potential of the second capacitor at a side opposite from the ground is inputted into the sense amplifier.

According to the embodiment, an output current from a memory cell is converted to a potential signal, which is further converted to a charge signal with use of the capacitor, so that the output current (current signal) which cannot be retained can be stored in the capacitor as a charge signal. This makes it possible to compare two current signals different in terms of time. Increasing the capacitance of each of the capacitors makes it possible to increase a noise margin (noise resistance) for various noises generated during a time difference between the first output readout and the second output readout.

In one embodiment, the memory cells are sidewall memories.

The "sidewall memory" is herein defined as a memory which has a source region, a drain region, a channel region formed between the source region and the drain region, a gate formed on the channel region, and charge retention regions formed on opposite sides of the gate.

In the sidewall memory, the potentials of the source region, the drain region and the gate are controlled so that the retention states of charges in those two charge retention regions are independently controlled to store information separately.

Since a memory cell including a sidewall memory has two charge retention regions, i.e., two storage sections, the integration degree of the semiconductor storage device can effectively be enhanced. In the sidewall memory having two storage sections, the current for reading information in one storage section is influenced by the storage state of the other storage section. Therefore, the sidewall memory has a characteristic in which cell current values vary in a wide range compared to the memory cell having one storage section. However, since the semiconductor storage device is adapted to compare the first output and the second output, information in the memory cell can correctly be determined even when current distributions when a current is passed from the from the first input/output terminal to the second input/output terminal and from the second input/output terminal to the first input/output terminal, respectively, in a plurality of memory cells selected by one word line are displaced with time, or these two current distributions are overlapped.

Electronic equipment in still another aspect of the present embodiment has the semiconductor storage device having any one of the aforementioned structures according to the present invention.

The "electronic equipment" herein refers to personal digital assistants, or portable information terminals, such as portable phones, liquid crystal display devices, DVD devices, visual equipment, audio equipment and copiers.

According to the present invention, the electronic equipment has the semiconductor storage device of the present invention which can determine information with high accuracy with a relatively simple structure, so that the reliability of the electronic equipment can be enhanced.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

The present invention will be described below in detail in conjunction with the embodiments with reference to the drawings.

First Embodiment

Figure 1:
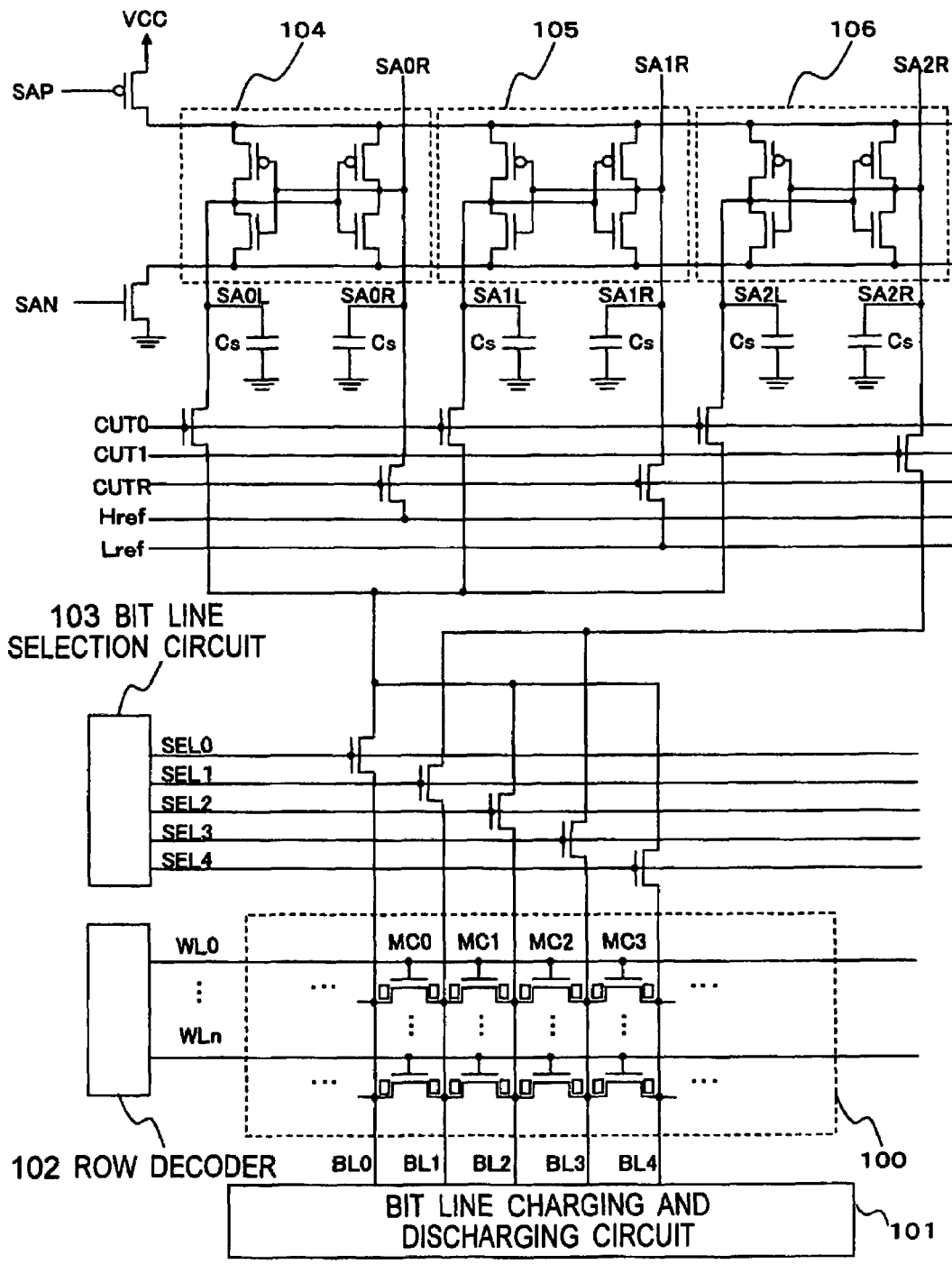
FIG. 1 is a view showing a semiconductor storage device in a first embodiment of the present invention.
Figure 5:
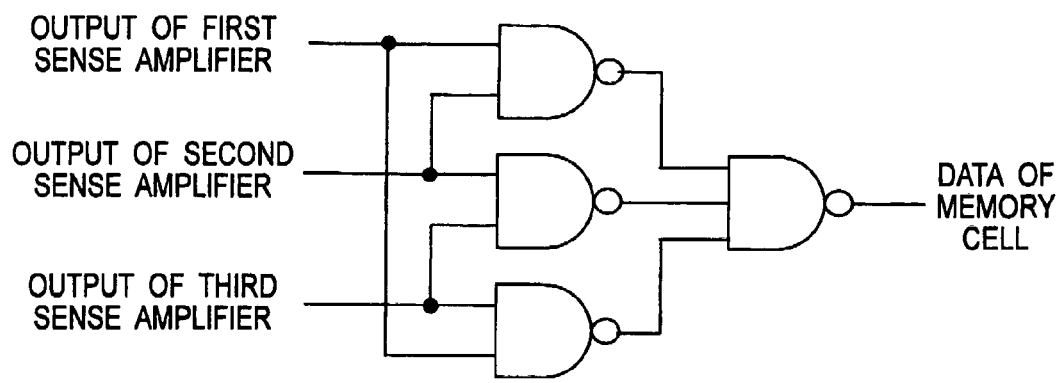
FIG. 5 is a circuit diagram of one example of a majority logic circuit.

FIG. 1 is a view showing a semiconductor storage device in a first embodiment of the present invention. The semiconductor storage device has a memory cell array 100 composed of a large number of nonvolatile memory cells MC0, MC1, . . . arranged in a matrix. A plurality of word lines WL0 to WLn connected to the control gates of memory cells aligned in the same row extend in the row direction of the memory cell array 100. Further, a plurality of bit lines BL0, BL1, BL2, BL3, . . . for connecting the input/output terminals of the memory cells aligned in the same column, i.e., for connecting the sources/drains of the memory cells aligned in the same column, extend in the column direction of the memory cell array 100. In each memory cell, the input/output terminal connected to a bit line on the left-hand side of the drawing sheet (referred to as a first bit line) is referred to as a first input/output terminal and the input/output terminal connected to a bit line on the right-hand side of the drawing sheet (referred to as a second bit line) is referred to as a second input/output terminal. The word lines WL0 to WLn are connected to a row decoder 102 for selecting a word line. The bit lines BL0, BL1, BL2, BL3, . . . are connected to a first sense amplifier 104, a second sense amplifier 105 and a third sense amplifier 106 by a transistor group selected by output signals SEL0 to SEL4 from a bit line selection circuit 103 and by a transistor group switched by a signal CUT0, a signal CUT1 and a signal CUTR. Though not shown in FIG. 1, outputs of the first to the third sense amplifiers 104 to 106 are connected to three input terminals of a majority logic circuit shown in FIG. 5 so as to prevent the different outputs from being connected to the same input terminal. Although four memory cells are connected to a set of sense amplifiers 104 to 106, the number of memory cells connected to the set of sense amplifiers is not particularly limited to four. It is to be noted that capacitances Cs at two input terminals of the respective sense amplifiers 104, 105, 106 represent parasitic capacitances of capacitive devices or capacitors parasitic on the input terminals of the sense amplifiers 104, 105, 106 disconnected from the bit lines by the CUT0 and CUT1 signals.

The memory cell array of the semiconductor storage device employs a virtual ground scheme to connect the bit lines BL0, BL1, BL2, BL3, . . ., so that under the operation of the bit line selection circuit 103, the memory cells are simultaneously read at the rate of one out of four memory cells. Instead of this scheme, a fixed ground scheme may be employed to connect the bit lines. As for the bit line selection circuit, any type of the bit line selection circuit is adoptable or the bit line selection circuit may be removed.

Figure 2:
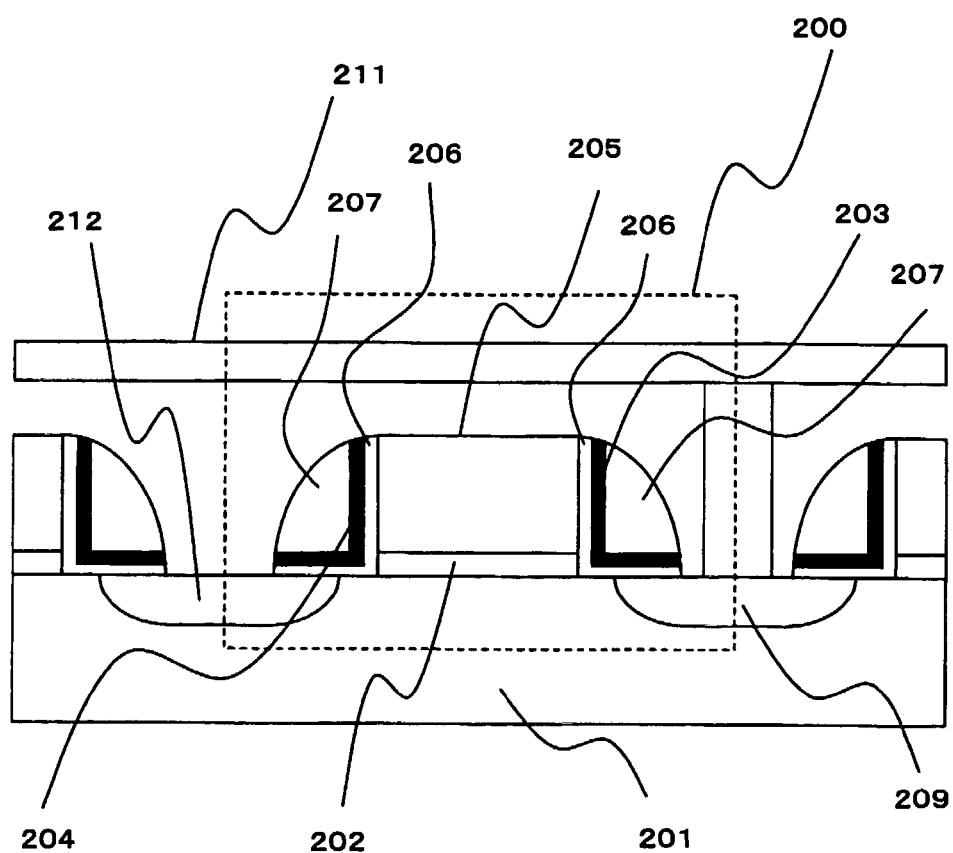
FIG. 2 is a cross sectional view of a sidewall memory.

FIG. 2 is a cross sectional view showing a sidewall memory 200 for use in the present embodiment as well as in later-described second and third embodiments. In the present embodiment, the following second and third embodiments as well as in their modified examples, it is assumed that when a storage region (storage node) of a memory (not limited to the sidewall memory) is in a programmed state, i.e., in a state that electrons have been injected in the storage region, then data 1 is stored in the storage region, whereas when a storage region is in an erased state, i.e., in a state in which electrons have been extracted from the storage region, then data 0 is stored in the storage region. It should naturally be understood that it is also possible to assume that when a storage region (storage node) is in the programmed state (in the state that electrons have been injected in the storage region), data 0 is stored in the storage region, whereas when a storage region is in the erased state (in the state in which electrons have been extracted from the storage region), data 1 is stored in the storage region.

The sidewall memory 200 has a first silicon nitride 203 and a second silicon nitride 204 functioning as the charge retention regions (storage regions). The sidewall memory 200 is set to store four values, data 0,0, data 0,1 data 1,0 and data 1,1 as two bit information. A word line 205 functioning as a gate electrode is formed on a substrate 201 via a gate insulating film 202, and the first and the second silicon nitrides 203, 204 are formed on both sides of the word line 205 via a silicon oxide 206. The first and the second silicon nitrides 203, 204, which are generally in L shape, have a longitudinal section extending in a direction generally parallel to the side wall of the word line 205 and a traverse section connecting to the lower end of the longitudinal section and extending in a direction generally parallel to the surface of the substrate 201 toward the side away from the word line 205. Silicon oxides 207, 207 are provided on the side of the first and the second silicon nitrides 203, 204 away from the word line 205. Thus, interposing the first and the second silicon nitrides 203, 204 in between the silicon oxide 206 and the silicon oxides 207, 207 increases the charge injection efficiency during rewrite operation so as to implement high-speed operation. Two diffusion regions are formed at the substrate 201 adjacent to the first and the second silicon nitrides 203, 204. More specifically, a diffusion region 209 is formed so as to overlap a part of the traverse section of the first silicon nitride 203 and to overlap a part of the traverse section of the silicon nitride included in an adjacent memory cell. Further, a first bit line 212 is formed so as to overlap a part of the traverse section of the second silicon nitride 204 and to overlap a part of the traverse section of the silicon nitride included in an adjacent memory cell. The diffusion region 209 and the first bit line 212 respectively function as a source region or a drain region. A channel region is set between the diffusion region 209 and the first bit line 212 functioning as the source region or the drain region. The first bit line 212 is connected to an unshown interconnection layer formed above the memory cell, whereas the diffusion region 209 is connected to a second bit line 211 formed above the memory cell 200.

Figure 3:
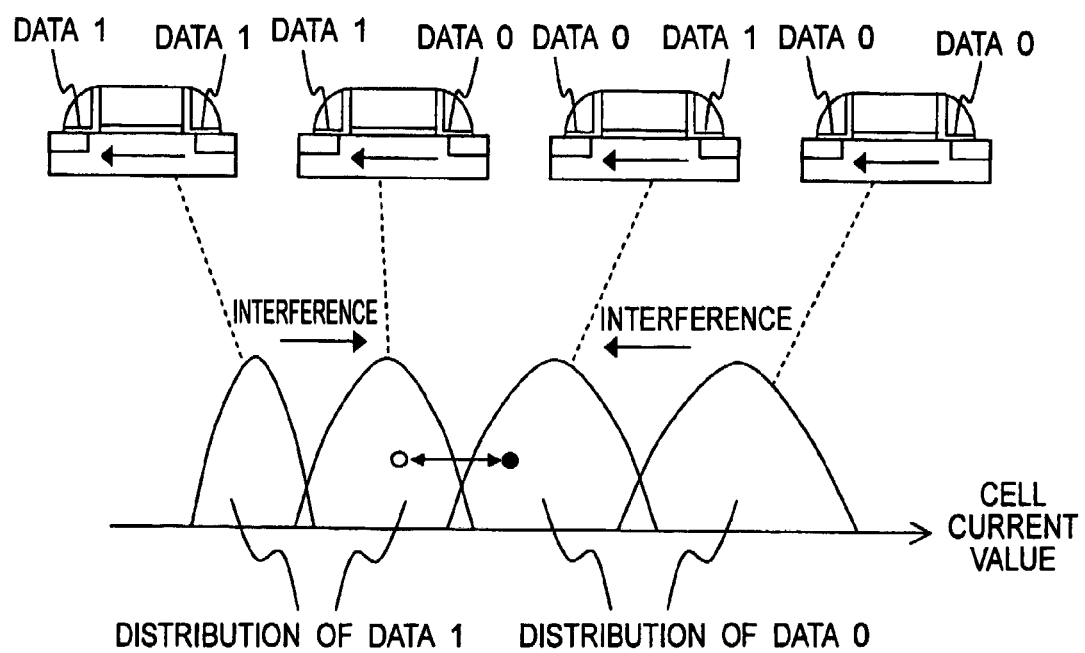
FIG. 3 is a view showing cell current distributions of memory cells with two storage nodes in different states.

FIG. 3 is a view showing cell current distributions of memory cells with two storage nodes (storage regions) in different states and schematically shows a state in which a left-side storage node (storage region) in memory cells is influenced by a right-side storage node (storage region) when a current is passed through the memory cells from the right-hand side to the left-hand side for reading of the left-side storage node.

In a memory having two storage nodes such as the sidewall memory, the two storage nodes interfere and read-out of one storage node is influenced by the state of the other storage node. Therefore, with respect to the distributions of cell current values of all the memory cells connected to one word line, the distribution of data 1 (data 1,1, data 1,0) in the storage nodes positioned on the left-hand side in FIG. 3 overlaps the distribution of data 0 (data 0,1, data 0,0) in the storage nodes positioned on the left-hand side in FIG. 3.

However, paying attention to one memory cell, when its storage nodes storing data 1 and data 0 interfere with each other, cell current values are different between the case where the storage node of data 1 is positioned downstream of a current flow as shown by symbol ○ in FIG. 3 and the case where the storage node of data 1 is positioned upstream of a current flow as shown by symbol ● in FIG. 3. Accordingly, data 1,0 and data 0,1 can be distinguished by comparing a cell current passed from one bit line to the other bit line for a selected memory cell with a cell current passed in the reversed direction. The point of the present invention lies in determining data 0 and data 1 by focusing attention on the difference in cell current.

Figure 4:
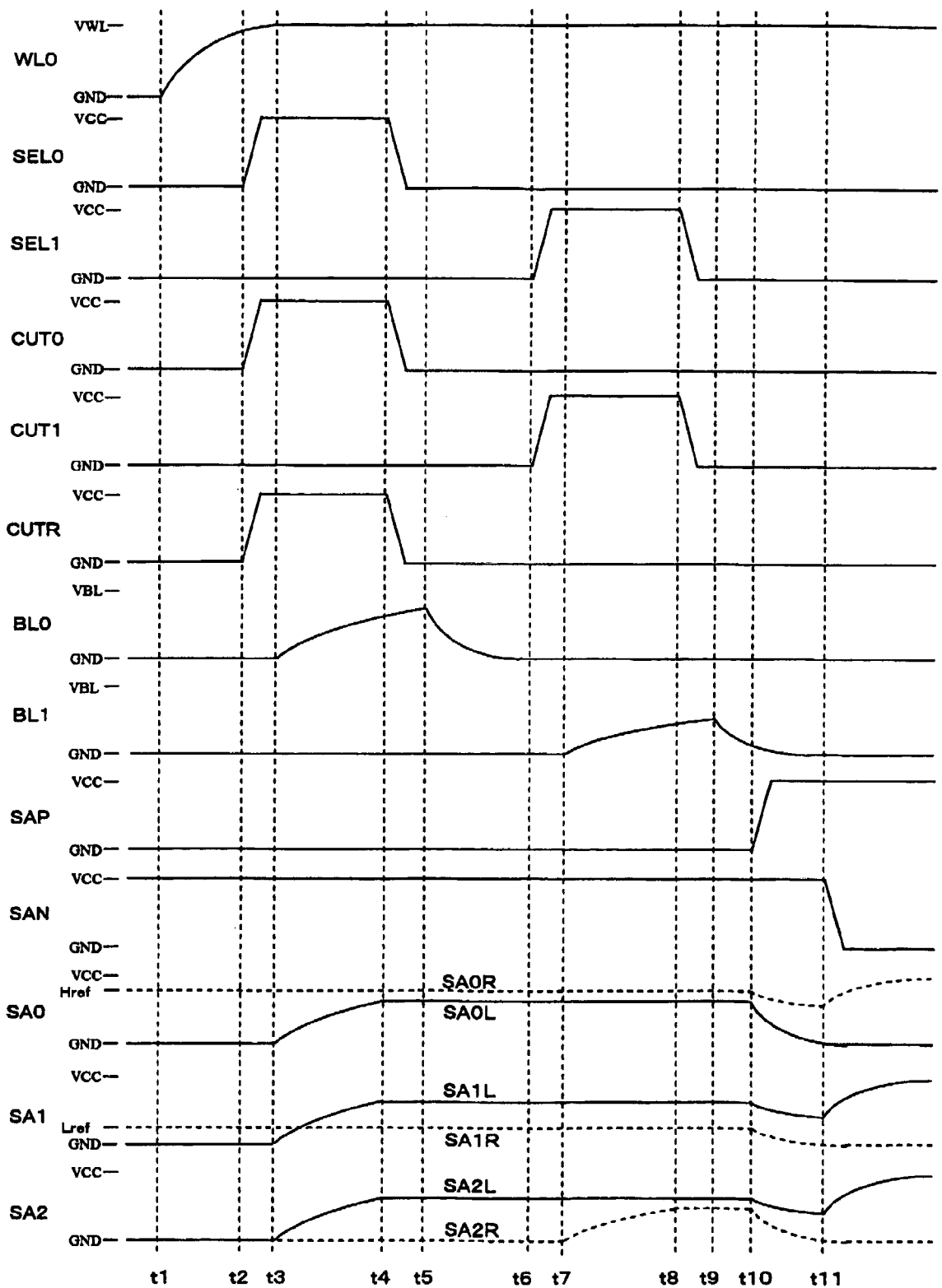
FIG. 4 is a timing chart for read operation in the first embodiment.

FIG. 4 is a timing chart explaining the read operation of the semiconductor storage device in the first embodiment. Signal names in FIG. 4 correspond to the signal names given to the signal lines in FIG. 1. The following description will be given of the case, as an example, where a memory cell MC0 connected to a word line indicated by WL0 in FIG. 1 is read out.

First, at time t1, a signal WL0 is raised to smoothly change the potential of the word line WL0 from GND to VWL. Next, at time t2, a signal SEL0, a signal CUT0 and a signal CUTR are raised. As a result, a bit line BL0 is connected to input terminals SA0L, SA1L, SA2L on the left-hand side of the respective sense amplifiers 104, 105, 106, while an input terminal SA0R is charged with a reference voltage (reference potential) Href as one example of the first reference value and an input terminal SA1R is charged with a reference voltage (reference potential) Lref as one example of the second reference value. Next, at time t3, a bit line charging and discharging circuit 101 fixes the potential of the bit line BL1 to GND while charging the bit line BL0 with VBL (e.g., 1.2 V). Next, at time t4, the signal SEL0, the signal CUT0 and the signal CUTR are made to fallen. The bit line BL0 is disconnected, so that a potential of the bit line BL0 at this point, which potential is as an example of the first output, is retained in the parasitic capacitors Cs on the input terminals SA0L, SA1L, SA2L on the left-hand side of the respective sense amplifiers 104, 105, 106, while the reference voltage Href is retained in the parasitic capacitor Cs on the input terminal SA0R, and the reference voltage Lref is retained in the parasitic capacitor Cs on the input terminal SA1R. At time t5, the potential of the bit line BL0 is discharged to GND, and at time t6, a signal SEL1 and a signal CUT1 are raised. As a result, the bit line BL1 is connected to an input terminal SA2R on the right-hand side of the third sense amplifier 106. At time t7, the bit line charging and discharging circuit 101 fixes the potential of the bit line BL0 to GND while charging the bit line BL1 with VBL (e.g., 1.2 V). At time t8, the signal SEL1 and the signal CUT1 fall. The bit line BL1 is disconnected, so that a potential of the bit line BL1 at this point as one example of the second output is retained in the parasitic capacitor Cs in the input terminal SA2R on the right-hand side of the third sense amplifier 106. At time t9, the potential of the bit line BL1 is discharged to GND. Now that the voltages of the input terminals of all the sense amplifiers 104, 105, 106 have been determined, a signal SAP is raised at time t10 and a signal SAN is made to fall at time t11 so as to operate the sense amplifiers 104, 105, 106.

As a result, as shown in FIG. 4, at the point of time when the bit line BL0 is disconnected, the potential of the input terminal SA0L is lower than the potential of the input terminal SA0R (i.e., reference voltage Href), the potential of the input terminal SA1L is higher than the potential of the input terminal SA1R (i.e., reference voltage Lref), and the potential of the input terminal SA2L is higher than the potential of the input terminal SA2R when the bit line BL1 is disconnected. As a result, the output signal SA0R of the first sense amplifier 104 becomes 1, the output signal SA1R of the second sense amplifier 105 becomes 0, and the output signal SA2R of the third sense amplifier 106 becomes 0. This result is inputted into the majority logic circuit shown in FIG. 5, and since the signals outputted from the sense amplifiers 104, 105, 106 include the signals 0 more than the signal 1, data 0 is outputted from the majority logic circuit.

Figure 6:
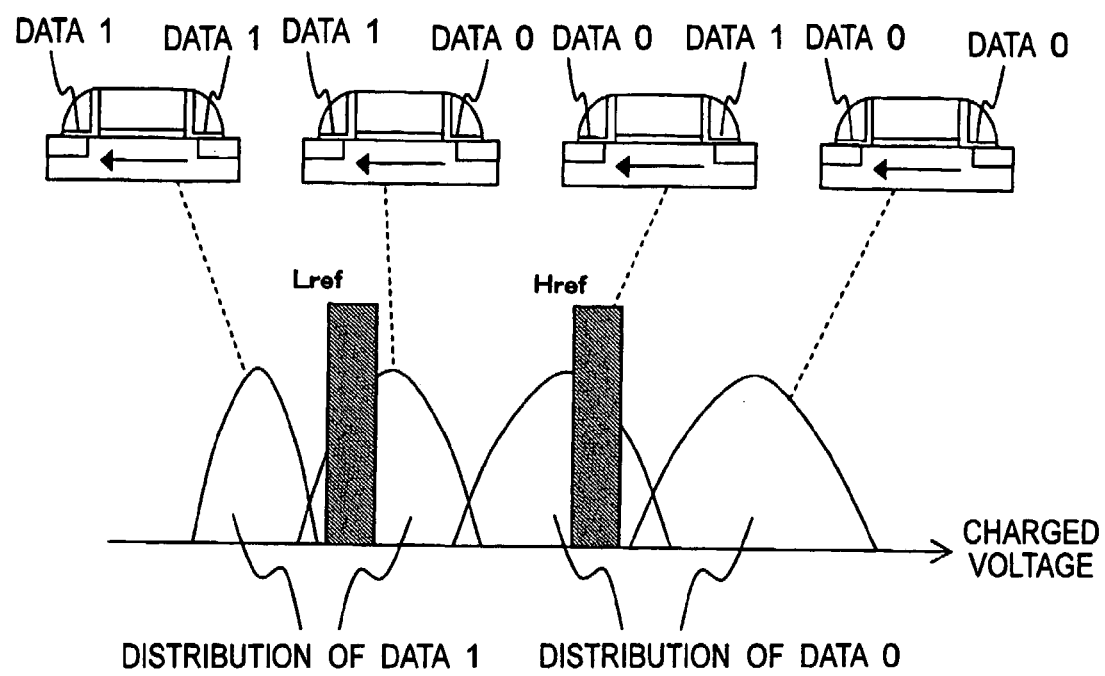
FIG. 6 is a view showing the relationship between the voltage distributions of memory cells with two storage nodes in different states at the time of charging, and two reference voltages.

At this point, as shown in FIG. 6, the reference voltage Lref is set to be higher than the upper limit (set on the right-hand side of the distribution of data 1,1 in FIG. 6) of the charge voltage of data 1,1 and is set to be lower than the lower limit of the charge voltage of data 0,1. The reference voltage Href is set to be lower than the lower limit (set on the left-hand side of data 0,0 in FIG. 6) of the charge voltage of data 0,0 and is set to be higher than the upper limit of the charge voltage of data 1,0. A setting method for the reference voltage Href and the reference voltage Lref will be described later. It is to be noted that the reference voltages Href and Lref have their respective margins, which are shown hatched in the figure, because the sense amplifiers have dead zones.

As shown in FIG. 6, in the case of data 1,1, that is, in the case in which both a read-side storage node (which is a first storage region) and a non-read interfering-side storage node (which is a second storage region) store data 1, the potentials applied to the input terminal SA0L and the input terminal SA1L are lower than the reference voltage Href and the reference voltage Lref, as a result of which both the output signal SA0R of the first sense amplifier 104 and the output signal SA1R of the second sense amplifier 105 become 1. On the other hand, the output signal SA2R of the third sense amplifier 106 becomes indefinite because the voltages of the output signal SA2R and the output signal AS2L are generally the same and thus it is impossible to determine whether it is 1 or 0. Hereinbelow, the indefinite state in which it is indefinite whether the signal represents 1 or 0 is shown by symbol x. Because two of the binary outputs from the first to the third sense amplifiers 104, 105, 106 are 1, the majority logic circuit for providing a binary output based on binary outputs from the first to the third sense amplifiers 104, 105, 106 by majority decision provides an output 1.

In the case of data 1,0, that is, in the case in which the read-side storage node stores data 1 while the interfering-side storage node stores data 0, the potential of the input terminal SA0L is lower than the reference voltage Href, so that the output signal SA0R of the first sense amplifier 104 becomes 1, while it is unknown whether the potential of the input terminal SA1L is higher or lower than the reference voltage Href (see FIG. 6) and so the output signal SA0R of the second sense amplifier 105 becomes indefinite x. As for the input terminal SA2R and the input terminal SA2L, the input terminal SA2R is higher in voltage, so that the output signal SA2R of the third sense amplifier 106 becomes 1. Therefore, since two of the binary outputs from the first to the third sense amplifiers 104, 105, 106 are 1, the output from the majority logic circuit definitely becomes 1.

In the case of data 0,1, that is, in the case in which the read-side storage node stores data 0 while the interfering-side storage node stores data 1, it is unknown whether the potential of the input terminal SA0L is higher or lower than the reference voltage Href (see FIG. 6), so that the output signal SA0R of the first sense amplifier 104 becomes indefinite x, while the potential of the input terminal SA1L is higher than the reference voltage Href, so that the output signal SA1R of the second sense amplifier 105 becomes 0. Moreover, since the potential of the input terminal SA2R is lower than the potential of the input terminal SA2L, the output signal SA2R of the third sense amplifier 106 becomes 0. Therefore, since two of the binary outputs from the first to the third sense amplifiers 104, 105, 106 are 0, the output from the majority logic circuit definitely becomes 0.

In the case of data 0,0, that is, in the case in which both the read-side storage node and the interfering-side storage node store data 0, the potentials of the input terminal SA0L and the input terminal SA1L are higher than the reference voltages Href and Lref, respectively, as a result of which both the output signal SA0R of the first sense amplifier 104 and the output signal SA1R of the second sense amplifier 105 become 0. Furthermore, the output signal SA2R of the third sense amplifier 106 becomes indefinite × because the input terminal SA2R and the input terminal SA2L have generally the same potential and it is impossible to determine whether output signals of these input terminals are 1 or 0. Consequently, since two of the binary outputs from the first to the third sense amplifiers 104, 105, 106 are 0, the output from the majority logic circuit definitely becomes 0.

Table 1 below shows the above results.

TABLE 1

| Read-side storage node (First storage region) | Interfering-side storage node (Second storage region) | Data of first sense amplifier | Data of second sense amplifier | Data of third sense amplifier | Output data from majority logic circuit |
|---|---|---|---|---|---|
| 1 | 1 | 1 | 1 | X | 1 |
| 1 | 0 | 1 | X | 1 | 1 |
| 0 | 1 | X | 0 | 0 | 0 |
| 0 | 0 | 0 | 0 | X | 0 |

As shown in Table 1, when data in the read-side storage node (first storage region) is 1, the output data from the majority logic circuit is 1 regardless of whether the data in the interfering-side storage node (second storage region) is 1 or 0. When the data in the read-side storage node (first storage region) is 0, the output data from the majority logic circuit is 0 regardless of whether the data in the interfering-side storage node (second storage region) is 1 or 0. Therefore, the information stored in the first storage region can correctly be read out. Although the present embodiment has been described with the right hand-side storage region 203 being a read-side storage node (first storage region) and with the left hand-side storage region 204 being an interfering-side storage node (second storage region), information readout can still be implemented by the same method when the storage region 204 is set as a read-side storage node (first storage region) and the storage region 203 is set as an interfering-side storage node (second storage region).

Second Embodiment

Figure 7:
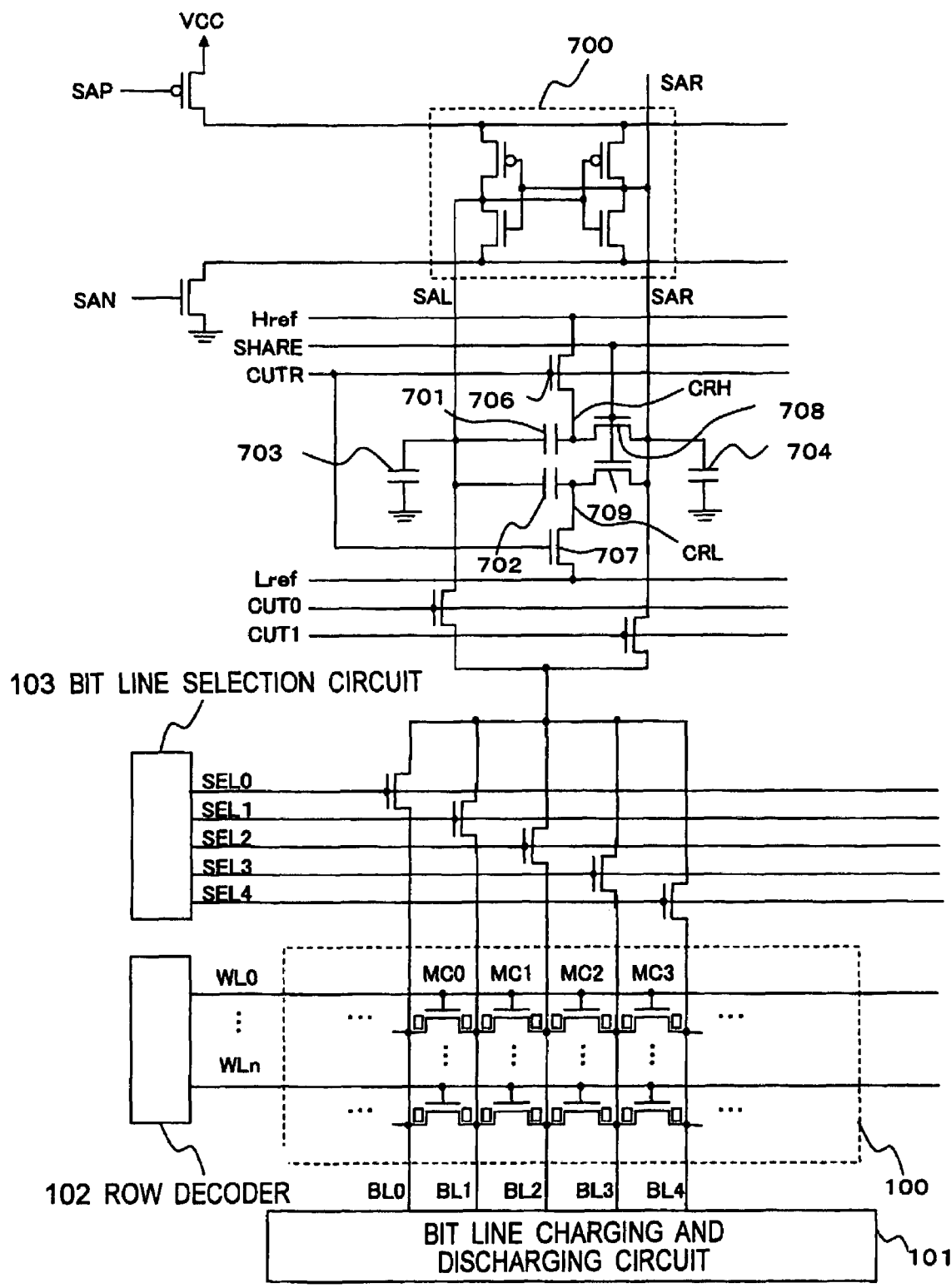
FIG. 7 is a view showing a semiconductor storage device in a second embodiment of the present invention.

FIG. 7 shows a semiconductor storage device in a second embodiment of the present invention. The present embodiment is different from the first embodiment in the point that a first capacitor (first capacitive device) 701 and a second capacitor (second capacitive device) 702 are provided so that these capacitors 701, 702 can share charges with a third capacitor 703 parasitic on one input terminal of a sense amplifier 700 and a fourth capacitor 704 parasitic on the other input terminal of the sense amplifier 700. This makes it possible to omit the majority logic circuit and reduce the number of sense amplifiers from three to one as described below.

Figure 8:
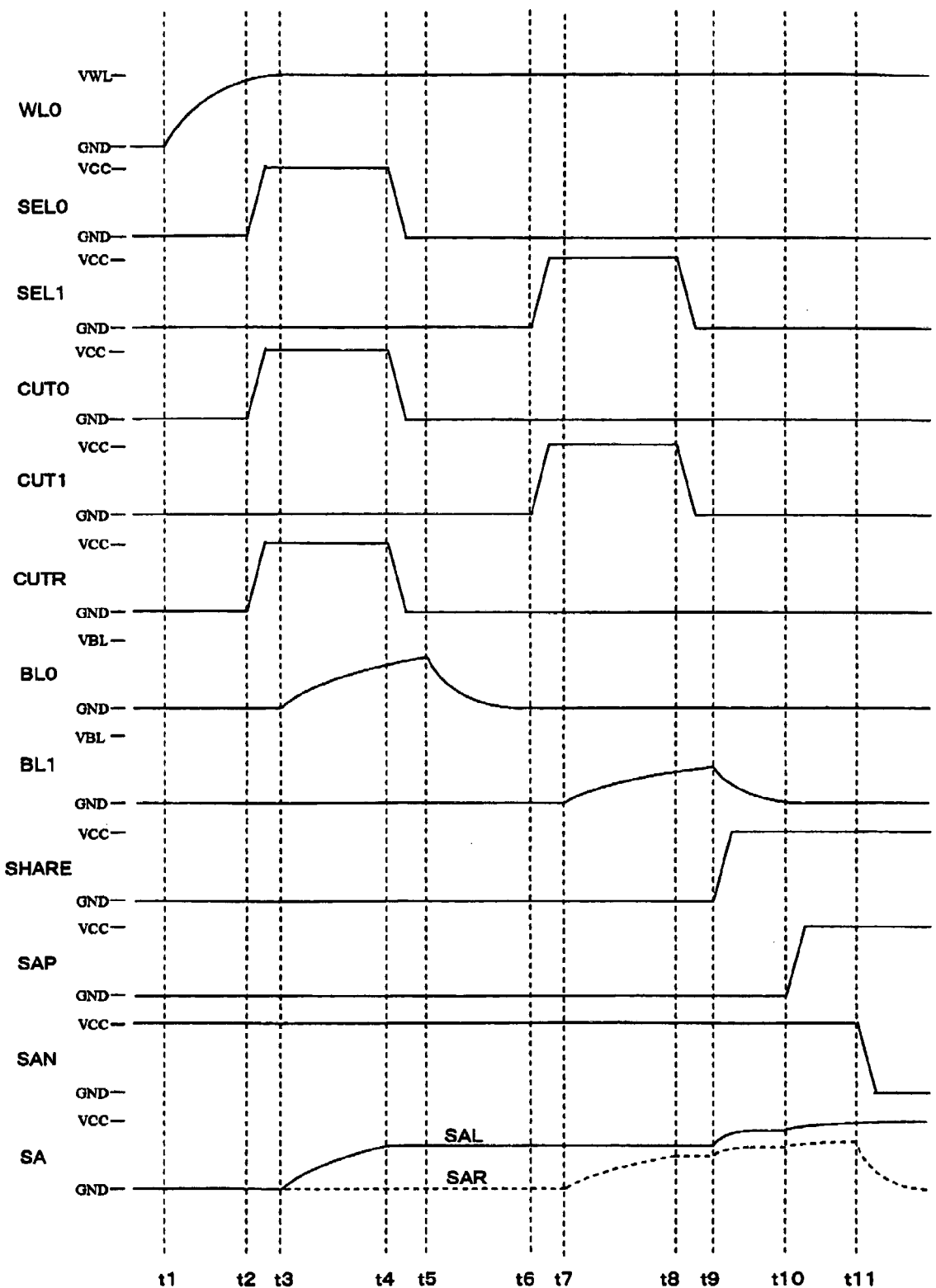
FIG. 8 is a timing chart for read operation in the second embodiment.

FIG. 8 is a timing chart explaining the read operation of the semiconductor storage device in the second embodiment. Signal names in FIG. 8 correspond to the signal names given to the signal lines in FIG. 7. Description will be given of the case where a memory cell MC0 connected to a word line WL0 is read out.

First, at time t1, the signal WL0 is raised to smoothly change the potential of the word line WL0 from GND to VWL. Next, at time t2, a signal SEL0, a signal CUT0 and a signal CUTR are raised. As a result, a bit line BL0 is connected to an input terminal SAL on the left hand-side of the sense amplifier 700 so that the potential of a node CRH becomes a reference voltage (reference potential) Href as a first reference potential while the potential of a node CRL becomes a reference voltage (reference potential) Lref as a second reference potential. At time t3, the bit line charging and discharging circuit 101 fixes the potential of a bit line BL1 to GND while charging the bit line BL0 with VBL (e.g., 1.2 V). At time t4, the signal SEL0, the signal CUT0 and the signal CUTR are made to fall. The bit line BL0 is disconnected, so that the potential of the input terminal SAL on the left hand-side of the sense amplifier 700, i.e., the potential at input terminal SAL-side electrodes of the first and the second capacitors 701, 702 and at an input terminal SAL-side (counter-ground side) electrode of the third capacitor 703 becomes a potential of the bit line BL0 as one example of the first output at this point, while the potential of the node CRH, i.e., the potential at an input terminal SAR-side electrode of the first capacitor 701 becomes a reference voltage Href, and the potential of the node CRL, i.e., the potential at an input terminal SAR-side electrode of the second capacitor 702 becomes a reference voltage Lref.

Next, at time t5, the potential of the bit line BL0 is discharged to GND, and at time t6, a signal SEL1 and a signal CUT1 are raised. As a result, the bit line BL1 is connected to the input terminal SAR on the right-hand side of the sense amplifier 700. At time t7, the bit line charging and discharging circuit 101 fixes the potential of the bit line BL0 to GND while charging the bit line BL1 with VBL (e.g., 1.2 V) At time t8, the signal SEL1 and the signal CUT1 are made to fall. The bit line BL1 is disconnected, so that a potential of the bit line BL1 at this point is retained as one example of the second output in the fourth capacitor 704 in the input terminal SAR on right-hand side of the sense amplifier 700. At time t9, the potential of the bit line BL1 is discharged to GND. A SHARE signal is raised to perform charge sharing between the first to the fourth capacitors 701, 702, 703, 704. The charge sharing is achieved by connecting a reference voltage Href-side electrode of the first capacitor 701, a reference voltage Lref-side electrode of the second capacitor 702, and a counter-ground side electrode of the fourth capacitor 704 through a switching section composed of a transistor 708 and a transistor 709. Now that the voltages at two input terminals of the sense amplifier 700 become definite, a signal SAP is raised at time t10 and a signal SAN is raised at time t11 so as to operate the sense amplifier 700. In the second embodiment, the sense amplifier 700 receives an input representing a total sum of the charges of the first to the fourth capacitors 701, 702, 703, 704.

Hereinbelow, description will be given of one example of the method of determining information in the first storage region in the second embodiment in the case where the capacitance of the first capacitor 701 is identical to the capacitance of the second capacitor 702, the parasitic capacitance of the third capacitor 703 is identical to the parasitic capacitance of the fourth capacitor 704, and the capacitance of the first capacitor 701 is ½ of the parasitic capacitance of the third capacitor 703. It is to be noted that the capacitances of the first to the fourth capacitors 701 to 704 can freely be set and once the capacitances of the first to fourth capacitors 701 to 704 have been set, an equation to express determination criterion ΔV as well as reference voltages Href, Lref should appropriately be determined in each case on the analogy of logic stated below.

In this example, the capacitances of the first and the second capacitors 701, 702 are half the capacitances of the third and the fourth capacitors 703, 704. Consequently, there hold four equations representing the amount of charges stored in each capacitor before the charge sharing, two equations representing retained charges before and after the charge sharing, and one equation relating to a potential after the charge sharing in a pass from the ground of a parasitic capacitance connected to one input terminal of the sense amplifier 700 to the ground of a parasitic capacitance connected to the other input terminal of the sense amplifier 700. Consequently, by solving the linear simultaneous equations in seven unknowns, a potential difference ΔV that appears at both the input terminals of the sense amplifier 700 after the charge sharing is expressed by Equation (1) below. (In the general case where the capacitances of the first and the second capacitors 701, 702 are not half the parasitic capacitances of the third and the fourth capacitors 703, 704, an equation expressing a potential difference ΔV appearing at both the input terminals of the sense amplifier 700 after the charge sharing, which is the equation corresponding to the Equation (1) below, can be obtained by solving linear simultaneous equations in eight unknowns).

$$\Delta V = \{(VL-Href) + (VL-Lref) + (VL-VR)\}/3 \quad (1)$$

wherein VL (mV) represents a voltage (potential) of the input terminal SAL before the charge sharing, Href (mV) represents a voltage of the node CRH, Lref (mV) represents a voltage of the node CRL, and VR (mV) represents a voltage (potential) of the input terminal SAR before the charge sharing. In the case of the present embodiment, whether the data in the first storage region is 1 or 0 is determined based on whether the ΔV value is positive or negative. More specifically, whether the data in the first storage region is 1 or 0 is determined based on whether the ΔV value is $\Delta V \leq -V0$ or $\Delta V \geq V0$ assuming that the sensitivity (dead zone width) of the sense amplifier is V0.

Ranges of Href and Lref in Equation (1) will be described later. Hereinbelow, it will be proved based on test results that information in the first storage region can correctly be read out by Equation (1).

Table 2 and Table 3 show the results of a test with VBL=1.2V, Lref=0V, Href=0.33 to 0.38V, the bit line capacitance being 1 pF, the charge time being 10 ns and the sense amplifier sensitivity V0 being 50 mV. It is to be noted that the charge voltage shown in Table 2 and Table 3 is a charge voltage for the charge time of 10 ns.

TABLE 2

| Storage state | Cell current (μA) when current is passed from second storage region side to first storage region side | Charge voltage VL (mV) | Cell current (μA) when current is passed from first storage region side to second storage region side | Charge voltage VR (mV) | Potential difference ΔV (mV) |
|---|---|---|---|---|---|
| Data 1, 1 | 10 | 88 | 10 | 88 | −68 to −51.3 |
| Data 1, 0 | 15 | 141 | 35 | 304 | −70.3 to −87 |
| Data 0, 1 | 35 | 304 | 15 | 141 | 130.3 to 147 |
| Data 0, 0 | 30 | 265 | 30 | 265 | 50 to 66.7 |

The result shown in Table. 2 shows no reversal of cell current magnitude relation between data 1,0 and data 0,1, which are most important data sets for determination, although between data 0,1 and data 0,0, the reversal of cell current magnitude relation (overlapping distributions) is seen. However, since $-68 \leq -50$ and $-70.3 \leq -50$, it can be determined from data 1,1 and data 1,0 that the information in the first storage region is 1. Moreover, since $130.3 \geq 50$ and $50 \geq 50$, it can be determined from data 0,1 and data 0,0 that the information in the first storage region is 0. Thus, the information in the first storage region can correctly be read out.

TABLE 3

| Storage state | Cell current (μA) when current is passed from second storage region side to first storage region side | Charge voltage VL (mV) | Cell current (μA) when current is passed from first storage region side to second storage region side | Charge voltage VR (mV) | Potential difference ΔV (mV) |
|---|---|---|---|---|---|
| Data 1, 1 | 10 | 88 | 10 | 88 | −68 to −51.3 |
| Data 1, 0 | 5 | 49 | 25 | 226 | −136.3 to −153 |
| Data 0, 1 | 25 | 226 | 5 | 49 | 83 to 100 |
| Data 0, 0 | 30 | 265 | 30 | 265 | 50 to 66.7 |

The result shown in Table 3 shows no reversal of cell current magnitude relation (overlapping distributions) between data 1,0 and data 0,1, which are most important data sets for determination, although between data 1,1 and data 1,0, the reversal of cell current magnitude relation (overlapped distributions) is seen. However, since $-68 \leq -50$ and $-136.3 \leq -50$, it can be determined from data 1,1 and data 1,0 that the information in the first storage region is 1. Moreover, since $83 \geq 50$ and $50 \geq 50$, it can be determined from data 0,1 and data 0,0 that the information in the first storage region is 0. Thus, the information in the first storage region can correctly be read out.

As shown in Table 2 and Table 3, the positions of intervals between data 1 and data 0 in two test results are very different. However, using the method in the second embodiment allows correct data readout.

Description is now given of the primacy of the second embodiment over the first embodiment in the setting of the reference voltage (reference potential).

Figure 9:
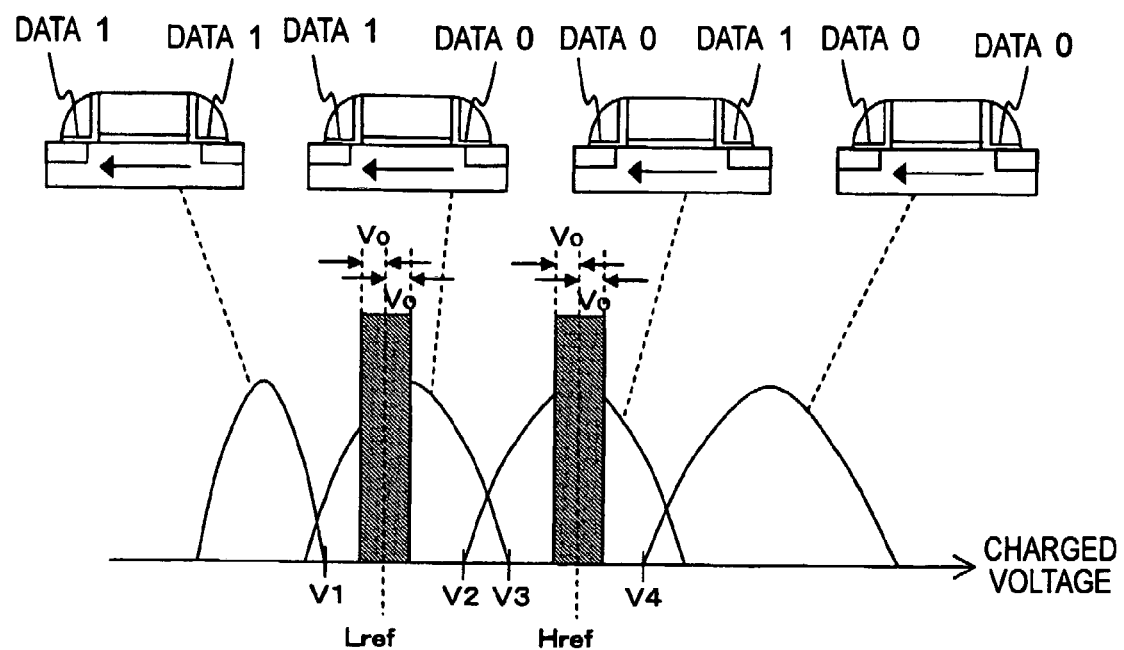
FIG. 9 is a view showing margins (settable ranges) of the reference voltages in the second embodiment.

Assuming that in the distributions, shown in FIG. 9, of voltages at charging corresponding to respective cell currents, the upper limit of the data 1,1 is V1 (mV), the lower limit of the data 0,1 is V2 (mV), the upper limit of the data 1,0 is V3 (mV), the lower limit of the data 0,0 is V4 (mV), and the dead zone width of the sense amplifier is V0 (mV), it is clear from FIG. 9 and Table 1 that in the first embodiment, the following relations hold for reference voltages Lref (mV) and Href (mV) for data 0,0 and data 1,1.

$$V1+V0 \leq Lref \leq V2-V0 \quad (2)$$

$$V3+V0 \leq Href \leq V4-V0 \quad (3)$$

In the second embodiment, by setting VL−VR=0 (this is considered to approximately hold) in Equation (1) and also setting $\Delta V \leq -V0$ and VL=V1 in the case of data 1,1 while $\Delta V \geq V0$ and VL=V4 in the case of data 0,0, the following equation can be obtained:

$$2V1+3V0 \leq Lref+Href \leq 2V4-3V0 \quad (4)$$

Moreover, both in the first and the second embodiments, by setting VL−VR=−V0, $\Delta V<-V0$ and VL=V2−V0 in the case of the data 1,0 and setting VL−VR=V0, $\Delta V \geq V0$, VL=V3+V0 in the case of the data 0,1, the following equation can be obtained:

$$2V2 \leq Lref+Href \leq 2V3 \quad (5)$$

Figure 10:
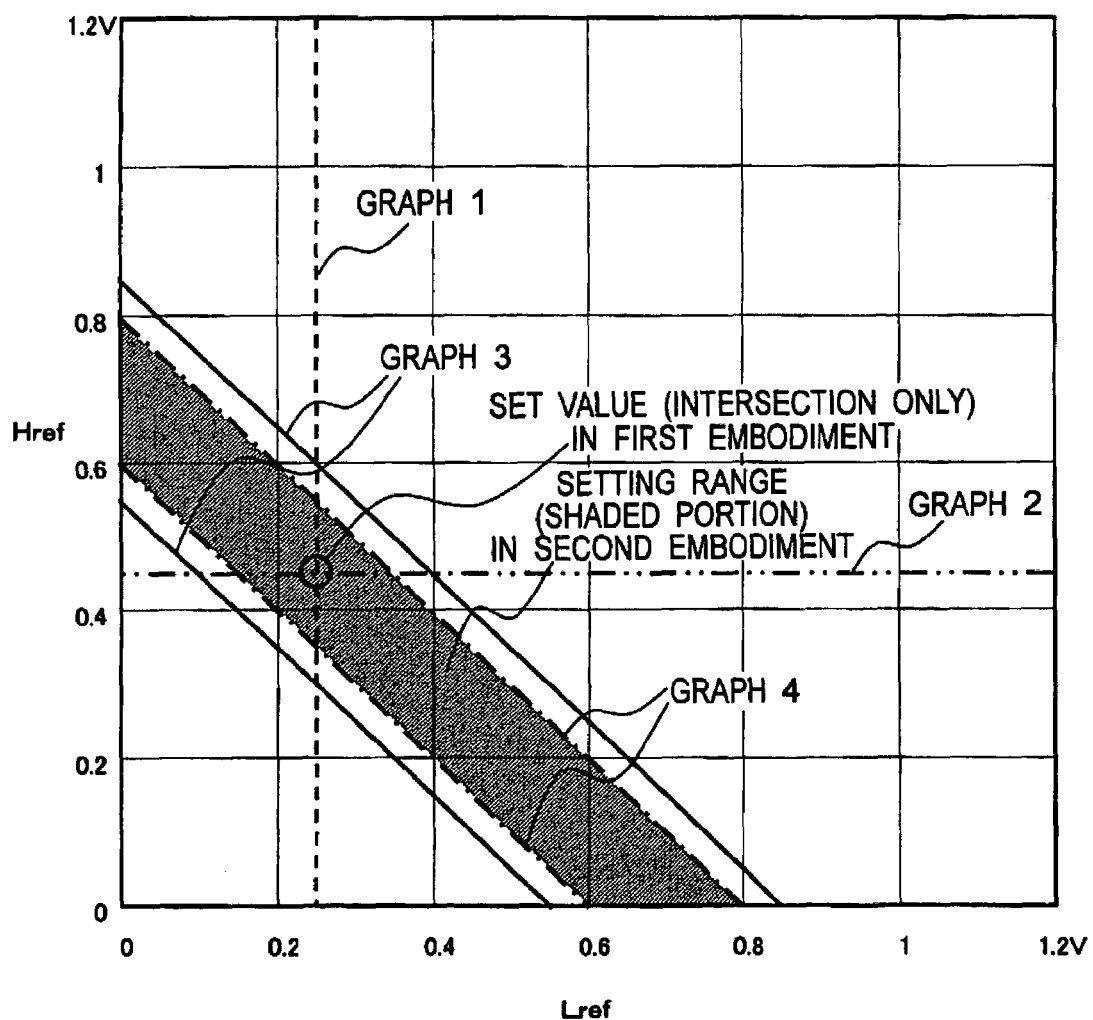
FIG. 10 is a graph showing the settable ranges of two reference voltages in the first and the second embodiments.

The relations of the above equations are shown in graph form in FIG. 10. In FIG. 10, graphs 1 to 4 correspond to Equations (2) to (5) with V1=0.2V, V2=0.3V, V3=0.4V, V4=0.5V, V0=50mV. As is clear from FIG. 10, values settable as the reference voltages in the first embodiment are precisely limited to Lref=0.25V and Href=0.45V (an intersection shown by a symbol ○ in the figure) since all of the graph 1, the graph 2 and the graph 4 should be satisfied. On the other hand, in the second embodiment, values settable as the reference voltages can freely be set from a range that is defined between two graphs 3 and 4 (shaded portion in the figure) since the graph 3 and the graph 4 only should be satisfied. When Lref=0V as described before, a Href range of 0.6 to 0.8V is usable. Therefore, in the second embodiment, the range settable for the reference voltage is quite large and a large design margin can be secured. Moreover in the second embodiment, strict requirements for the reference voltages Href and Lref as in the first embodiment are not present, so that by setting the reference voltage Lref at, for example, stable 0V, it becomes possible to eliminate dispersion which would otherwise generated during generation of the reference voltage.

In the second embodiment, the first output is applied to the third capacitor 703 having one end connected to the ground while the second output is applied to the fourth capacitor 704 having one end connected to the ground. However, instead of the third capacitor 703 and the fourth capacitor 704, a capacitor for storing electric charge equivalent to a potential difference between the first output and the second output may be used, and in such a case, one capacitor can be omitted, that is, the capacitors are reduced in number by one. In this case, switching between connection and disconnection of the first capacitor, the second capacitor and the third capacitor is performed by a switching circuit such that electric charge equivalent to a potential difference between the first output and the first reference potential is stored in the first capacitor, that electric charge equivalent to a potential difference between the first output and the second reference potential is stored in the second capacitor, that electric charge equivalent to a potential difference between the first output and the second putout is stored in the third capacitor, that the first capacitor, the second capacitor and the third capacitor are connected in parallel, and that a potential difference corresponding to the sum of the charge equivalent to the potential difference between the first output and the first reference potential stored in the first capacitor, the charge equivalent to the potential difference between the first output and the second reference potential stored in the second capacitor and the charge equivalent to the potential difference between the first output and the second putout stored in the third capacitor is outputted to a sense amplifier. This makes it possible to correctly determine and read the information in the first storage region in each memory cell.

Although in the second embodiment, a potential difference between a potential of the third capacitor 703 on the opposite side of the ground and a potential of the fourth capacitor 704 on the opposite side of the ground is inputted into the sense amplifier 700, a potential difference between electrode plates of the first capacitor after the charge sharing may be inputted into the sense amplifier or a potential difference between electrode plates of the second capacitor after the charge sharing may be inputted into the sense amplifier in the present invention. In the case where the capacitors are reduced in number by one as in the above-mentioned modified example, a potential difference after the charge sharing in the capacitor which stores, before the charge sharing, electric charge equivalent to a potential difference between the first output and the second output may be inputted into the sense amplifier.

In the second embodiment, the third capacitor 703 and the fourth capacitor 704 are internal capacitors in the sense amplifier, which are parasitic on the input terminals of the sense amplifier 700. In the present invention, however, at least one of the third capacitor and the fourth capacitor may be an external capacitive device, such as a diode, provided outside the sense amplifier. Although the electrodes on the left hand-side, as viewed in the figure, of the first and the second capacitors 701, 702 are directly connected to the input terminal SAL in the above description, transistors corresponding to the transistors 708, 709 may be connected to the left hand-side, as viewed in the figure, of the first and the second capacitors 701, 702 such that the transistors are symmetrical to the transistors 708, 709 with respect to the first and the second capacitors 701, 702. In this case, though the number of circuit components increases, the parasitic capacitance of the input terminal SAL in the sense amplifier 700 becomes equal to the parasitic capacitance of the input terminal SAR, so that the characteristics of the sense amplifier 700 are improved.

Third Embodiment

Figure 11:
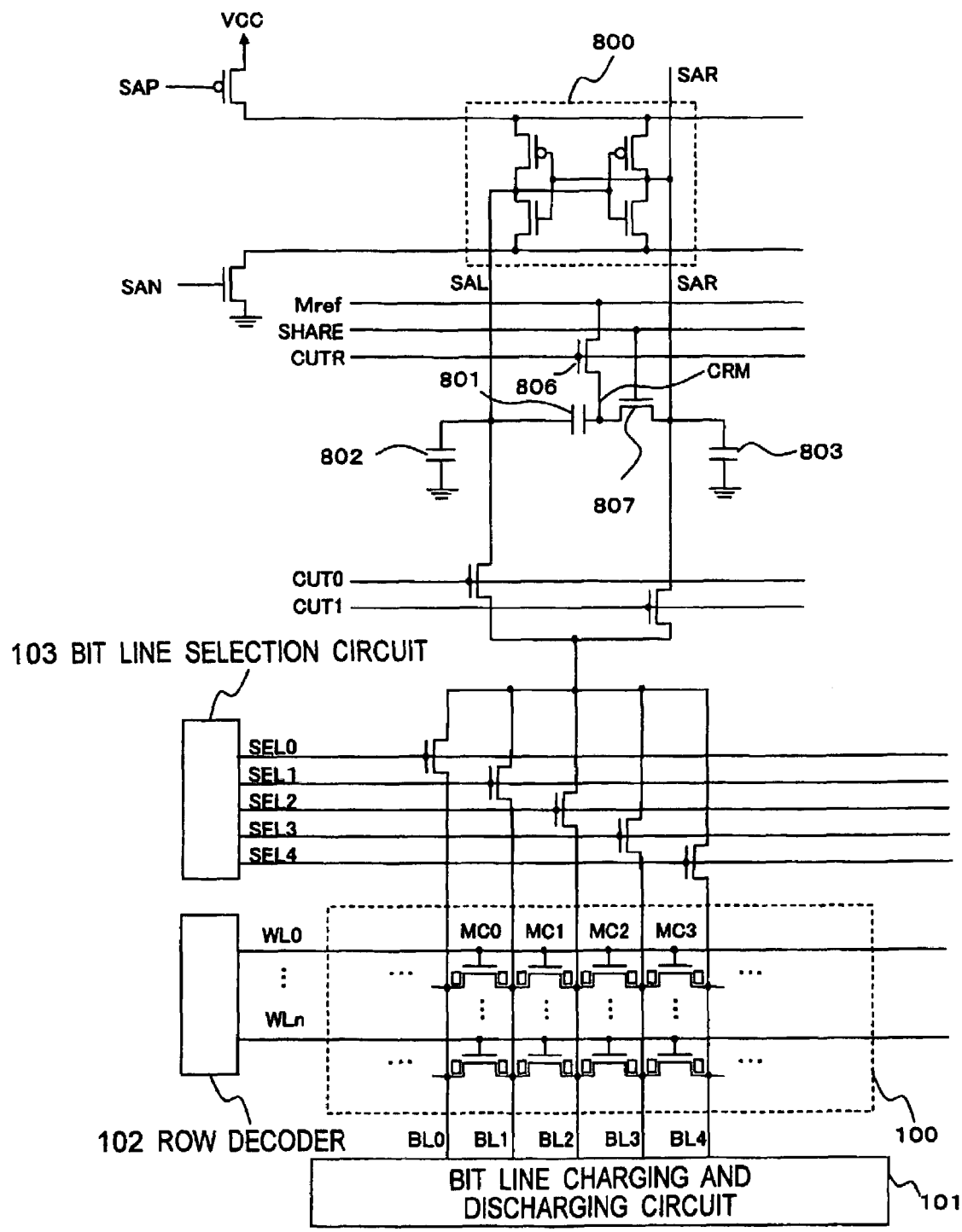
FIG. 11 is a view showing a semiconductor storage device in a third embodiment of the present invention.

FIG. 11 is a view showing a semiconductor storage device in a third embodiment of the present invention. The third embodiment is different from the second embodiment in that the capacitive devices include a first capacitor 801, a second capacitor 802 parasitic on one input terminal of a sense amplifier 800, and a third capacitor 803 parasitic on the other input terminal of the sense amplifier 800 (the parasitic capacitance of the third capacitor 803 is equal to the parasitic capacitance of the second capacitor 802) and that the reference voltage (reference potential) is limited to a first reference potential Mref. In the third embodiment, a transistor 807 constitutes a switching section. Also, the sense amplifier 800 is adapted to receive a total sum of electric charges of the first to the third capacitors 801, 802, 803. The operation of the semiconductor storage device in the third embodiment is similar to that in the second embodiment, and therefore the semiconductor storage device in the present embodiment shares the timing chart in FIG. 8 with the second embodiment. By defining Mref as Mref=(Href+Lref)/2 and setting a capacitance value of the first capacitor 801 to be identical to the parasitic capacitance of the second capacitor 802, the same ΔV equation in the second embodiment applies, and therefore an operation result of the circuit in the third embodiment is perfectly identical to that in the second embodiment. The third embodiment has advantage over the second embodiment in the point that the number of devices constituting the circuit and the number of reference voltages are decreased.

In the third embodiment, the first output is applied to the second capacitor 802 having one end connected to the ground while the second output is applied to the third capacitor 803 having one end connected to the ground. However, instead of the second capacitor and the third capacitor, a capacitor for storing electric charge equivalent to a potential difference between the first output and the second output may be used, and in such a case, the capacitors are reduced in number by one. In this case, switching between connection and disconnection of the first capacitor and the second capacitor is performed by a switching circuit so that electric charge equivalent to a potential difference between the first output and the first reference potential is stored in the first capacitor, that electric charge equivalent to a potential difference between the first output and the second output is stored in the second capacitor, that the first capacitor and the second capacitor are connected in parallel, and that a potential difference corresponding to a sum of the charge equivalent to the potential difference between the first output and the first reference potential stored in the first capacitor and the charge equivalent to the potential difference between the first output and the second output stored in the second capacitor is outputted to the sense amplifier. This makes it possible to correctly determine and read the information in the first storage region in each memory cell.

Although in the third embodiment, a potential difference between a potential of the second capacitor 802 on the opposite side of the ground and a potential of the third capacitor 803 on the opposite side of the ground is inputted into the sense amplifier 800, a potential difference between electrode plates of the first capacitor after the charge sharing may be inputted into the sense amplifier in the present invention. In the case where the capacitors are reduced in number by one as in the above-mentioned modified example, a potential difference after the charge sharing in the capacitor which stores, before the charge sharing, electric charge equivalent to a potential difference between the first output and the second output may be inputted into the sense amplifier.

In the third embodiment, the second capacitor 802 and the third capacitor 803 are internal capacitors in the sense amplifier, which are parasitic on the input terminals of the sense amplifier 800. In the present invention, however, at least one of the second capacitor and the third capacitor may be an external capacitive device, such as a diode, provided outside the sense amplifier. Although the electrode on the left hand-side, as viewed in the figure, of the first capacitor 801 is directly connected to the input terminal SAL in the third description, a transistor corresponding to the transistor 807 may be connected to the left hand-side of the first capacitor 801 such that the transistor is symmetrical to the transistor 807 with respect to the first capacitor 801. In this case, though the number of circuit components increases, the parasitic capacitance of the input terminal SAL in the sense amplifier 800 becomes equal to the parasitic capacitance of the input terminal SAR, so that the characteristics of the sense amplifier 800 are improved.

Figure 12:
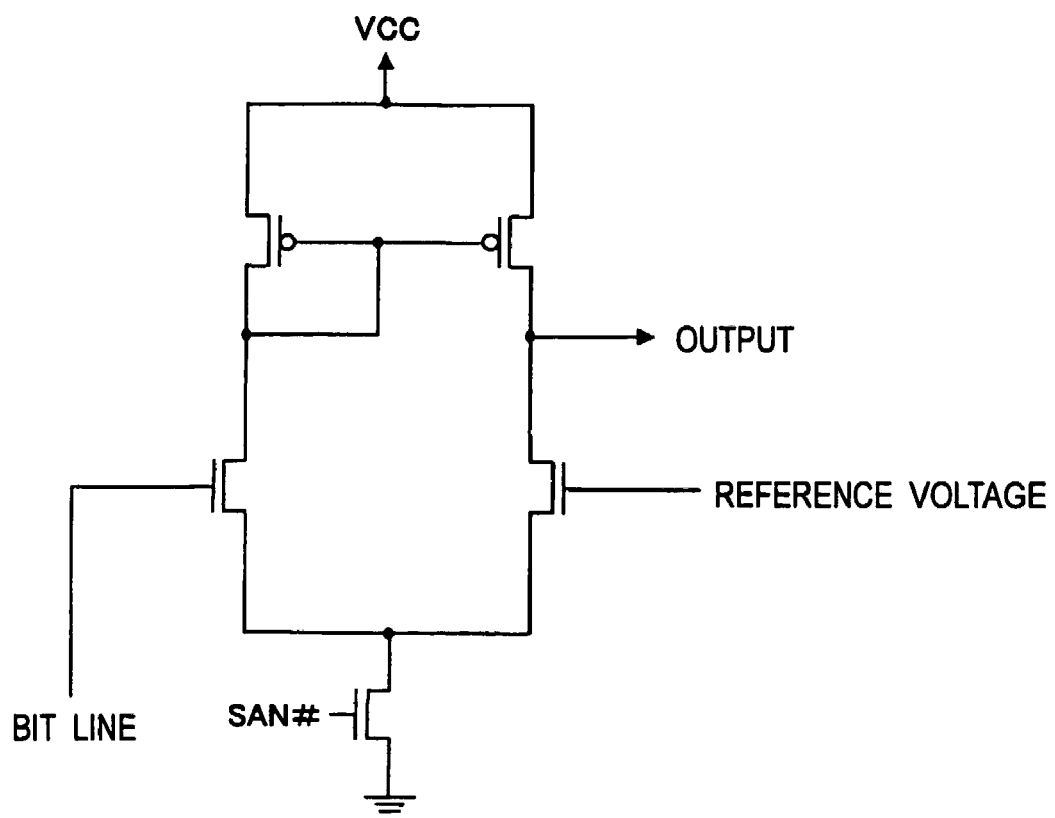
FIG. 12 is a circuit diagram of one example of a current mirror-type current amplifier.

The sense amplifiers in the first to the third embodiments as mentioned above are differential amplification-type voltage amplifier. However, alternatively, current mirror-type current amplifiers shown in FIG. 12 may also be used. The capacitance value of each capacitor may freely be set. After the capacitance value of each capacitor is set, an appropriate reference voltage (reference potential) should be set.

In the first to the third embodiments, the first output is a potential of the bit line BL0 connected to the left hand-side terminal, as viewed in the figure, of a memory cell when current is passed from the left hand-side terminal to the right-hand side terminal, as viewed in the figure, of the memory cell, while the second output is a potential of the bit line BL1 connected to the right-hand side terminal, as viewed in the figure, of a memory cell when a current is passed from the right-hand side terminal to the left hand-side terminal of the memory cell. In other words, the first output is a potential of the bit line connected to the first input/output terminal when a current is passed from the first input/output terminal to the second input/output terminal, and the second output is a potential of the bit line connected to the second input/output terminal when a current is passed from the second input/output terminal to the first input/output terminal. In the present invention, however, the first output may be a potential of the bit line connected to the second input/output terminal when a current is passed from the first input/output terminal to the second input/output terminal, and the second output may be a potential of the bit line connected to the first input/output terminal when a current is passed from the second input/output terminal to the first input/output terminal.

Moreover, the first output of a memory cell can be defined as a potential of the first or the second bit line gained by charging or discharging in the case where the first bit line on one side of the memory cell is set to have a higher potential than the second bit line on the other side, while the second output can be defined as a potential of the second or the first bit line obtained by charging or discharging in the case where the second bit line is set to have a higher potential than the first bit line. In this case, when the first output is a potential of the first bit line, the second output is a potential of the second bit line. When the first output is an output caused by charging, the second output is an output caused by charging, whereas when the first output is an output caused by discharging, then the second output is an output caused by discharging.

The sidewall memories, one of which is shown in FIG. 2, are adopted for all of the memory-cells included in the memory cell array in the first to the third embodiments. However, in the present invention, only some of the memory cells included in the memory cell array may be sidewall memories shown in FIG. 2. The memory cell array may also include memory cells having cross sections shown in FIG. 13 to FIG. 17.

Figure 13:
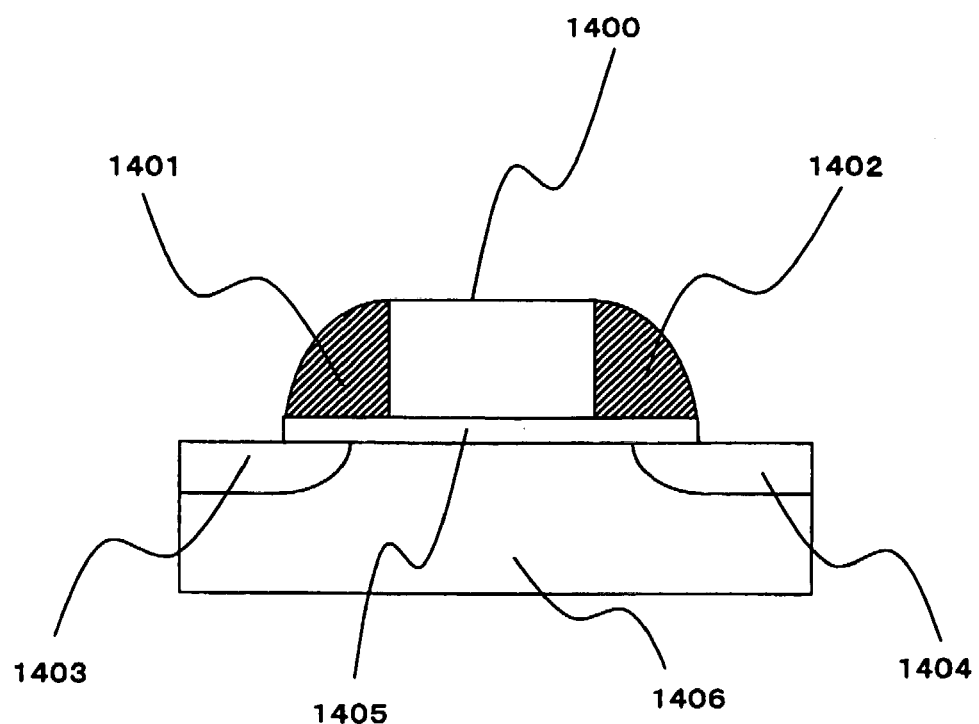
FIG. 13 is a cross sectional view showing the structure of a memory cell usable in the semiconductor storage device in the present invention.

As shown in FIG. 13, a sidewall memory may be structured so that an oxide 1405 and a gate 1400 are sequentially formed on a substrate 1406, and a first storage layer 1401 as a first storage region and a second storage layer 1402 as a second storage region are formed on the oxide 1405 and on both of opposite sides of the gate 1400 in a generally symmetric manner. Further, a first diffusion layer 1403 is formed at a surface of the substrate 1406 so as to overlap the first storage layer 1401, and a second diffusion layer 1404 is formed at the surface of the substrate 1406 so as to overlap the second storage layer 1402 and so as not to come into contact with the first diffusion layer 1403.

Figure 14:
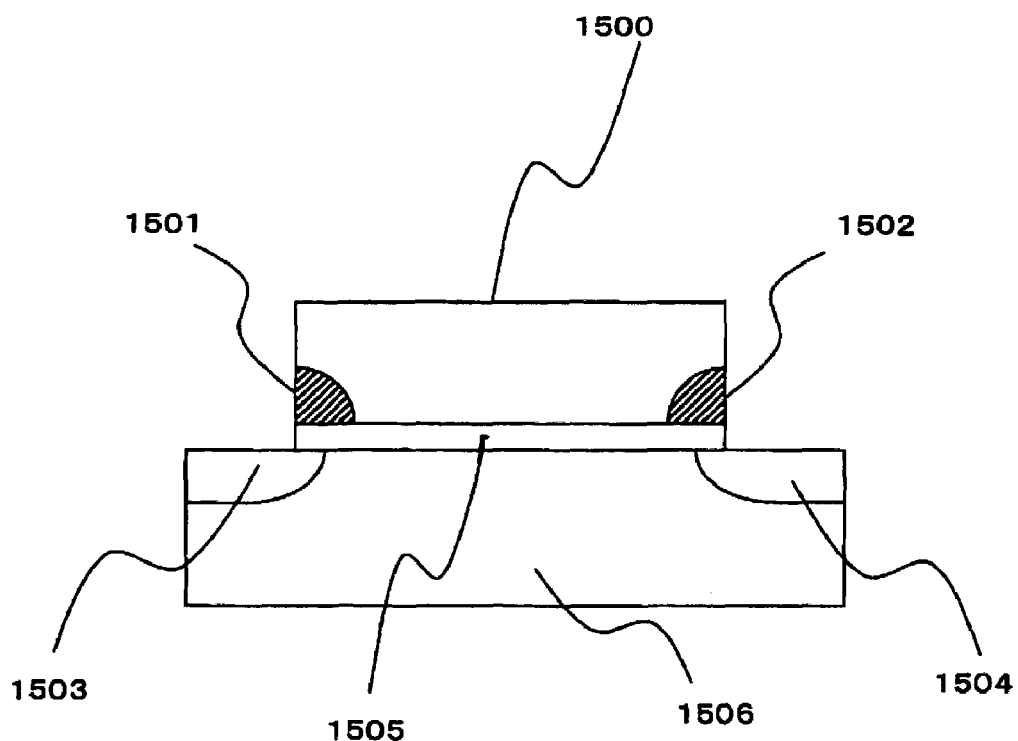
FIG. 14 is a cross sectional view showing the structure of a memory cell usable in the semiconductor storage device in the present invention.

As shown in FIG. 14, a sidewall memory may be structured so that an oxide 1505 and a gate 1500 are sequentially formed on a substrate 1506, and a first storage layer 1501 having a quadrant cross section as a first storage region and a second storage layer 1502 having a quadrant cross section as a second storage region are formed in opposite two corners of the gate 1500 and on the side of the oxide 1505. Further, a first diffusion layer 1503 is formed at a surface of the substrate 1506 so as to overlap the first storage layer 1501, and a second diffusion layer 1504 is formed at the surface of the substrate 1506 so as to overlap the second storage layer 1502 and so as not to come into contact with the first diffusion layer 1503.

Figure 15:
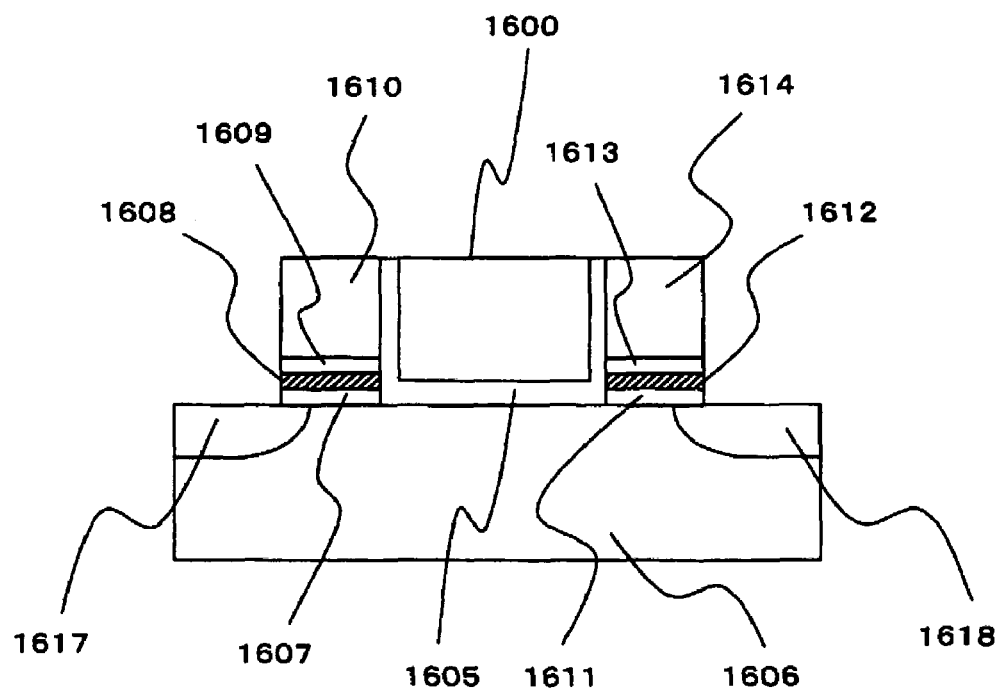
FIG. 15 is a cross sectional view showing the structure of a memory cell usable in the semiconductor storage device in the present invention.

As shown in FIG. 15, a sidewall memory may be structured so that an oxide 1605 having a generally U-shaped cross section is formed on a substrate 1606, and a gate 1600 is formed in a recess section of the oxide 1605. An oxide 1607, a first storage layer 1608 as a first storage region, an oxide 1609 and a gate 1610 are stacked on the substrate 1606 and on one side of the oxide 1605, while an oxide 1611, a second storage layer 1612 as a second storage region, an oxide 1613 and a gate 1614 are formed on the substrate 1606 and on the other side of the oxide 1605. Further, a first diffusion layer 1617 is formed at a surface of the substrate 1606 so as to overlap the first storage layer 1608, and a second diffusion layer 1618 is formed at the surface of the substrate 1606 so as to overlap the second storage layer 1612 and so as not to come into contact with the first diffusion layer 1617.

Figure 16:
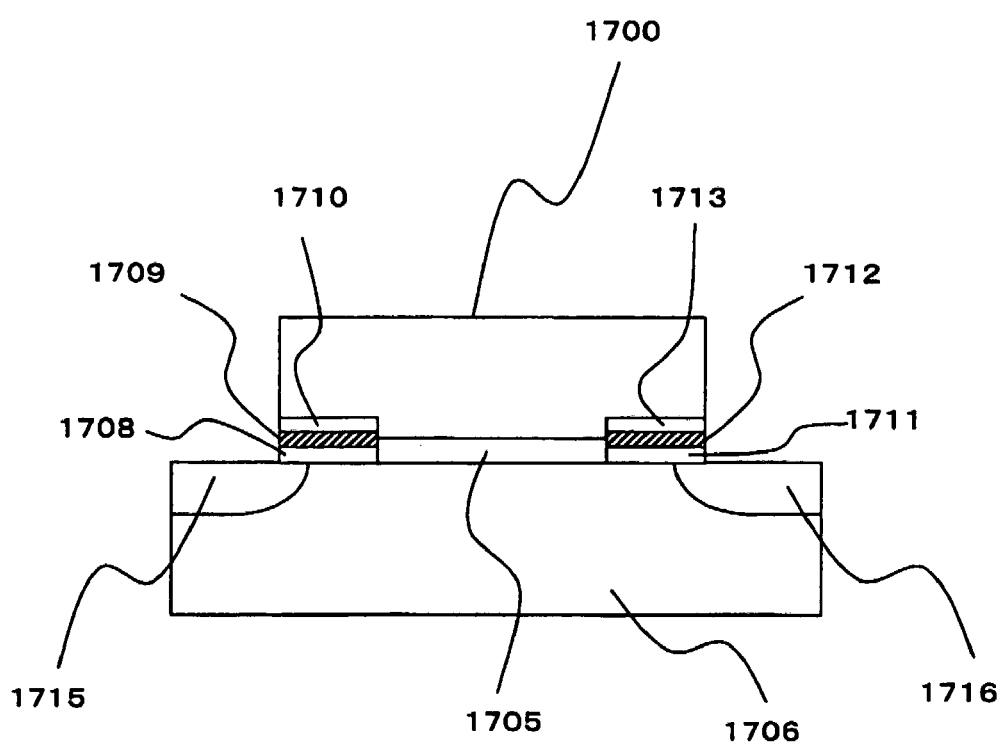
FIG. 16 is a cross sectional view showing the structure of a memory cell usable in the semiconductor storage device in the present invention.

As shown in FIG. 16, a sidewall memory may be structured so that an oxide 1705 is formed on a substrate 1706, and a gate 1700 having a convex cross section is formed on the oxide 1705 in such a manner that the convex side of the gate 1700 is in contact with the entire upper surface of the oxide 1705. An oxide 1708, a first storage device 1709 as a first storage region and an oxide 1710 are sequentially formed on one side of the oxide 1705 and between the substrate 1706 and the gate 1700, while an oxide 1711, a second storage device 1712 as a second storage region and an oxide 1713 are sequentially formed on the other side of the oxide 1705 and between the substrate 1706 and the gate 1700. Further a first diffusion layer 1715 is formed at a surface of the substrate 1706 so as to overlap the first storage layer 1709, and a second diffusion layer 1716 is formed at the surface of the substrate 1706 so as to overlap the second storage layer 1712 and so as not to come into contact with the first diffusion layer 1715.

Figure 17:
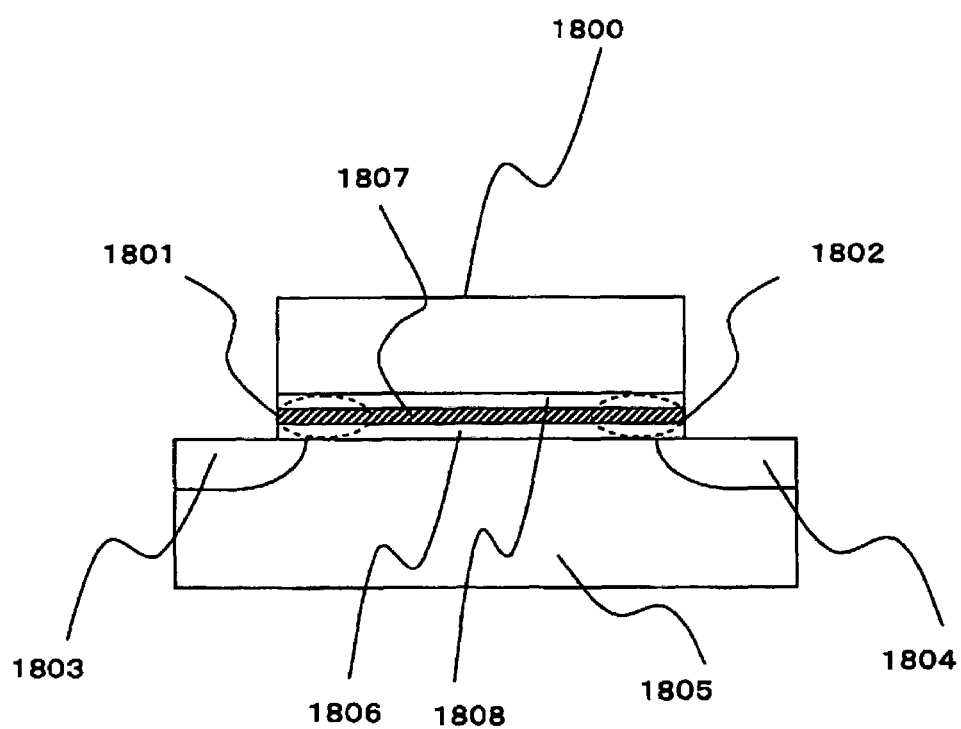
FIG. 17 is a cross sectional view showing the structure of a memory cell usable in the semiconductor storage device in the present invention.

As shown in FIG. 17, a sidewall memory may be structured so that an oxide 1806, a silicon nitride 1807, an oxide 1808 and a gate 1800 are sequentially formed on a substrate 1805, and a first diffusion layer 1803 is formed at a surface of the substrate 1805 so as to overlap the silicon nitride 1807, and a second diffusion layer 1804 is formed at the surface of the substrate 1805 so as to overlap the silicon nitride 1807 and so as not to come into contact with the first diffusion layer 1803. It is to be noted that in the structure shown in FIG. 17, one side of a sandwich structure composed of the oxide 1806, the silicon nitride 1807 and the oxide 1808 in cross section is used as a first storage section 1801 serving as a first storage region and the other side of the sandwich structure in cross section is used as a second storage section 1802 serving as a second storage region.

Fourth Embodiment

Figure 18:
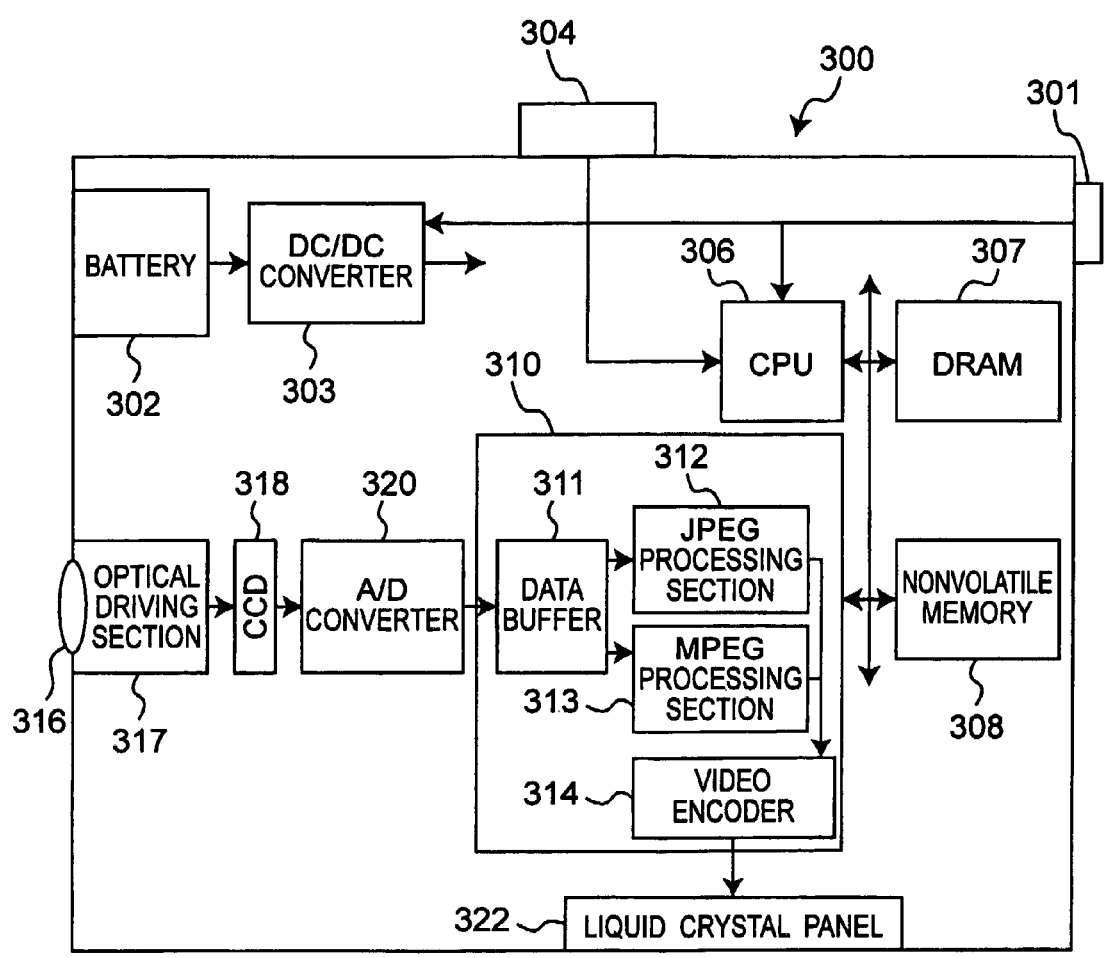
FIG. 18 is a block diagram of a digital camera as one example of electronic equipment in a fourth embodiment of the present invention.

FIG. 18 is a block diagram showing a control system of a digital camera as one example of electronic equipment in the present invention. The digital camera has a flash memory as a semiconductor storage device so that photographed images are stored in the flash memory. The flash memory has the structure according to the above-described first, the second, or the third embodiment, or any one of their modified examples.

As shown in FIG. 18, in the digital camera, once a power switch 301 is turned on by an operator, electric power supplied from a battery 302 is transformed to a specified voltage in a DC/DC converter 303 and is supplied to each component. Light coming from a lens 316 is converted to a current in a CCD 318 and then is converted to a digital signal in an analog-digital converter (A/D converter) 320 before being inputted into a data buffer 311 in an image processing section 310. The signal inputted into the data buffer 311 is subjected to motion picture processing in an MPEG processing section 313 and then transmitted to a video encoder 314 to be a video signal before being displayed on a liquid crystal panel 322. Once a shutter 304 is pressed by an operator, information in the data buffer 311 is processed as a static image in a JPEG processing section 312 and then is stored in a flash memory 308 as one example of the semiconductor storage device of the present invention. The flash memory 308 stores photographed image information as well as system programs and the like. A DRAM 307 is used for temporary storage of data generated during various processing steps in a CPU 306 and the image processing section 310.

In order to decrease a bit unit cost, the flash memory 308 in the digital camera needs to reduce the chip area, and in order to achieve downsizing and increase in continuous operating time of the battery 302, power consumption needs to be curtailed. Further, since one pixel failure causes deterioration in image quality of the images stored in the flash memory 308, the reliability of data in store should be increased. Further, the reliability of data when the data is stored for a long time should be increased.

The flash memory 308 according to the present invention can correctly read the information in memory cells even when the interval between distributions of cell current values of data 0 and data 1 are extremely narrowed or overlapped. Therefore, the digital camera having the flash memory 308 in the present invention can achieve not only cost reduction and downsizing but also high reliability.

Fifth Embodiment

Figure 19:
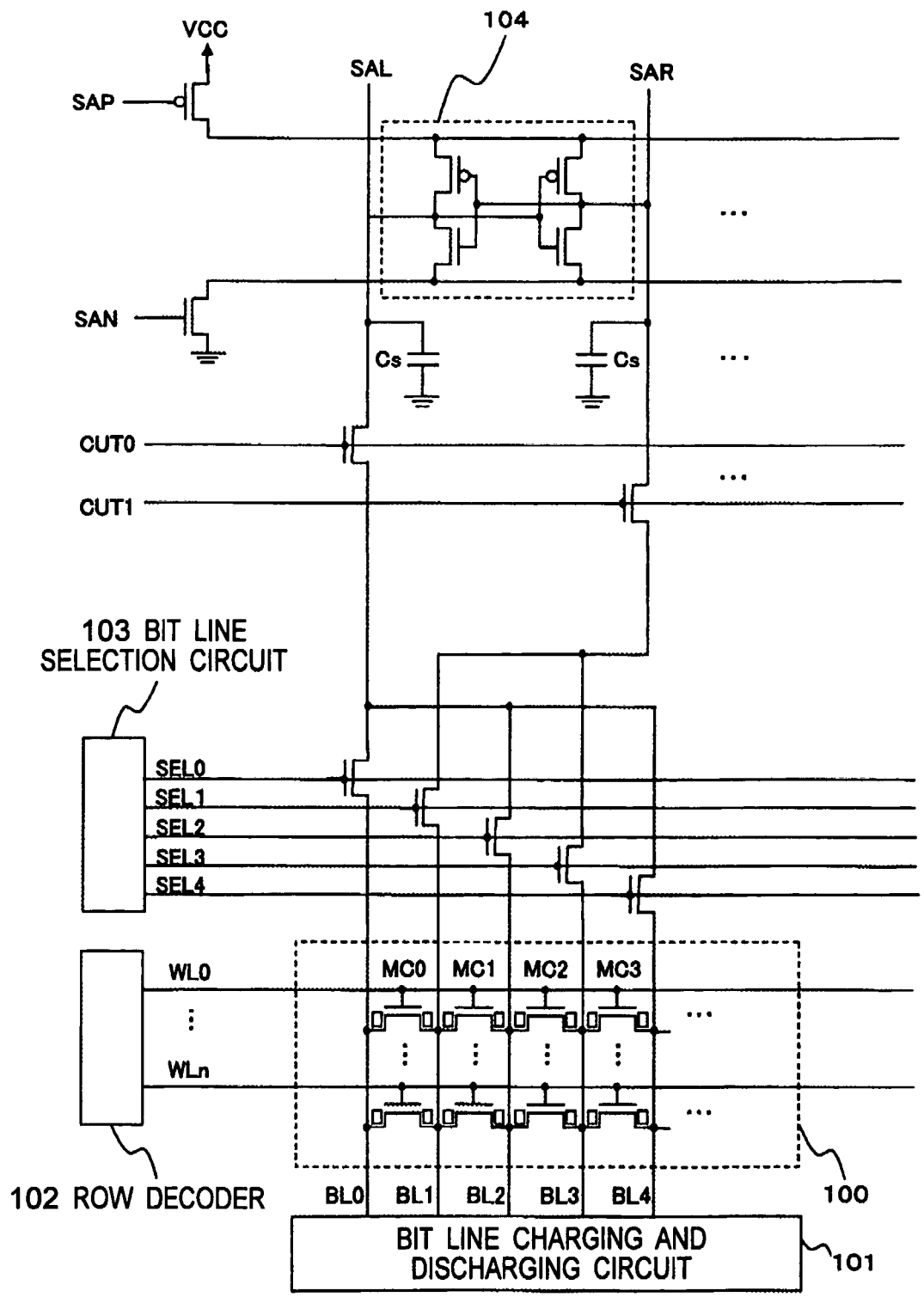
FIG. 19 is a view showing a semiconductor storage device in a fifth embodiment of the present invention.

FIG. 19 shows a semiconductor storage device in a fifth embodiment of the present invention. In FIG. 19, components identical to those of the semiconductor storage device in the first embodiment shown in FIG. 1 are designated by reference numerals identical to those used in FIG. 1 and detailed description will be omitted. The description relating to FIG. 1 also applies to FIG. 19, although in the semiconductor storage device in FIG. 1, the bit lines BL0, BL1, BL2, BL3, . . . are connected to the sense amplifiers by a transistor group selected by the output signals SEL0 to SEL4 from the bit line selection circuit 103 and by a transistor group switched by the signal CUT0, the signal CUT1 and the signal CUTR. However, in the semiconductor storage device in the fifth embodiment, the bit lines are connected to a sense amplifier 104 by a transistor group selected by output signals SEL0 to SEL5 from the bit line selection circuit 103 and by a transistor group switched by a signal CUT0 and a signal CUT1.

A memory cell array 100 of the semiconductor storage device employs the virtual ground scheme to connect the bit lines BL0, BL1, BL2, BL3, . . . as in the first embodiment, so that under the operation of the bit line selection circuit 103, the memory cells are simultaneously read at the rate of one out of four memory cells. However, the fixed ground scheme may be employed to connect the bit lines instead. As for the bit line selection circuit, any type of the bit line selection circuit is adoptable or the bit line selection circuit may be removed.

Since the cross sectional structure of a sidewall memory used as the memory cell in the fifth embodiment is identical to the cross sectional structure of the sidewall memory 200 in the first embodiment shown in FIG. 2, the sidewall memory for use in the fifth embodiment will be described hereinbelow with reference to FIG. 2, although the description overlapping the description made in the first embodiment will be omitted.

The sidewall memory 200 for use in the fifth embodiment stores one-bit information made of data 0 and data 1 by writing information onto either the first silicon nitride 203 or the second silicon nitride 204.

Figure 20:
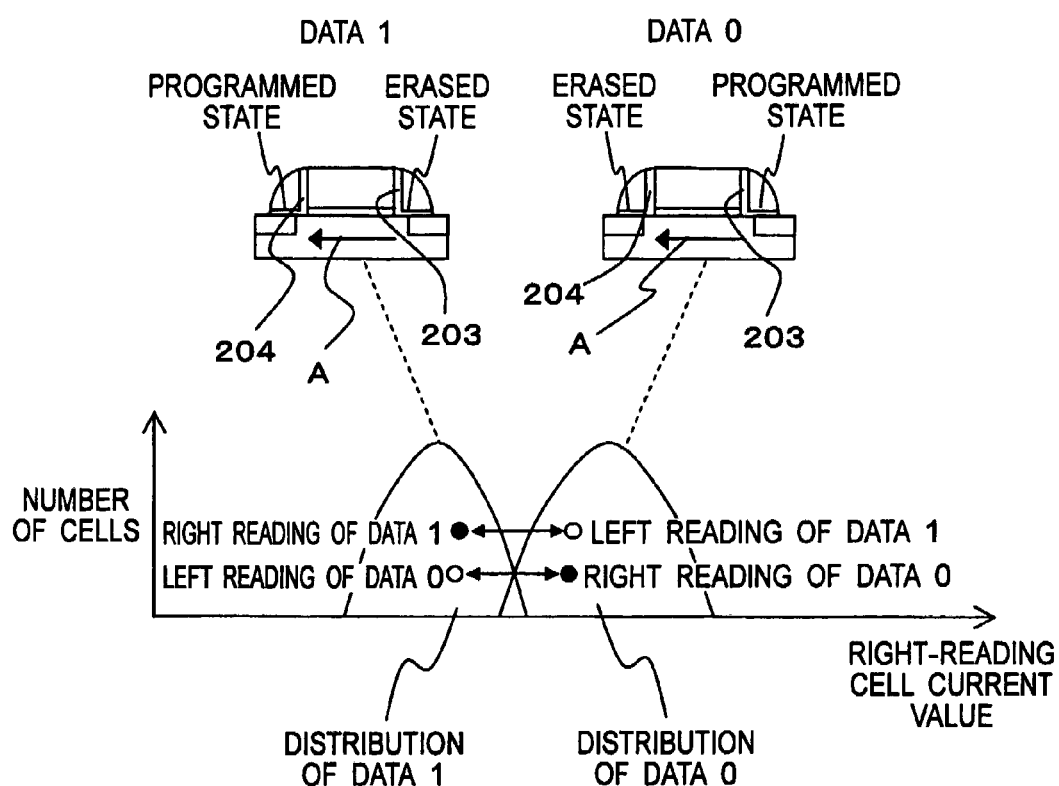
FIG. 20 is a view showing cell current distributions of memory cells with their storage nodes in different states.

FIG. 20 is a view showing cell current distributions of storage nodes (storage regions) in the sidewall memory in different states.

In the example shown in FIG. 20, the state in which programming is made (electrons are injected) to the right-hand side silicon nitride 203 in the memory cell and the left hand-side silicon nitride 204 is kept in the erased state (the state that electrons are extracted) is defined as data 0, while the state in which programming is made (electron are injected) to the left hand-side silicon nitride 204 in the memory cell and the right-hand side silicon nitride 203 is kept in the erased state (the state that electrons are extracted) is defined as data 1. It is naturally acceptable to reverse the definition, that is, the state in which programming is made (electrons are injected) to the right-hand side silicon nitride 203 in the memory cell and the left hand-side silicon nitride 204 is kept in the erased state (the state that electrons are extracted) can be data 1, while the state in which programming is made (electron are injected) to the left hand-side silicon nitride 204 in the memory cell and the right-hand side silicon nitride 203 is kept in the erased state (the state that electrons are extracted) can be data 0. FIG. 20 shows distributions of cell current values of all the memory cells connected to one word line when a current is applied to each memory cell from the right-hand side to the left hand-side in a direction A shown in the drawing. As shown in FIG. 20, the distributions of data 0 and data 1 sometimes overlap. However, when paying attention to one memory cell, there is definitely a difference between a right-reading cell current value (shown by symbol ●) obtained when a current is passed from right to left in the direction A in FIG. 20 and a left-reading cell current value (shown by symbol ○) obtained when a current is passed from left to right in a direction opposite to the direction A in FIG. 20. Accordingly, the major point of the present invention is to determine data 0 and data 1 by performing comparison between a case where a cell current is passed from a bit line connected to one input/output terminal of a selected memory cell to a bit line connected to the other input/output terminal of the memory cell and a case where a cell current is passed in the opposite direction.

Description will be hereinbelow given of the read operation in the fifth embodiment.

Figure 21:
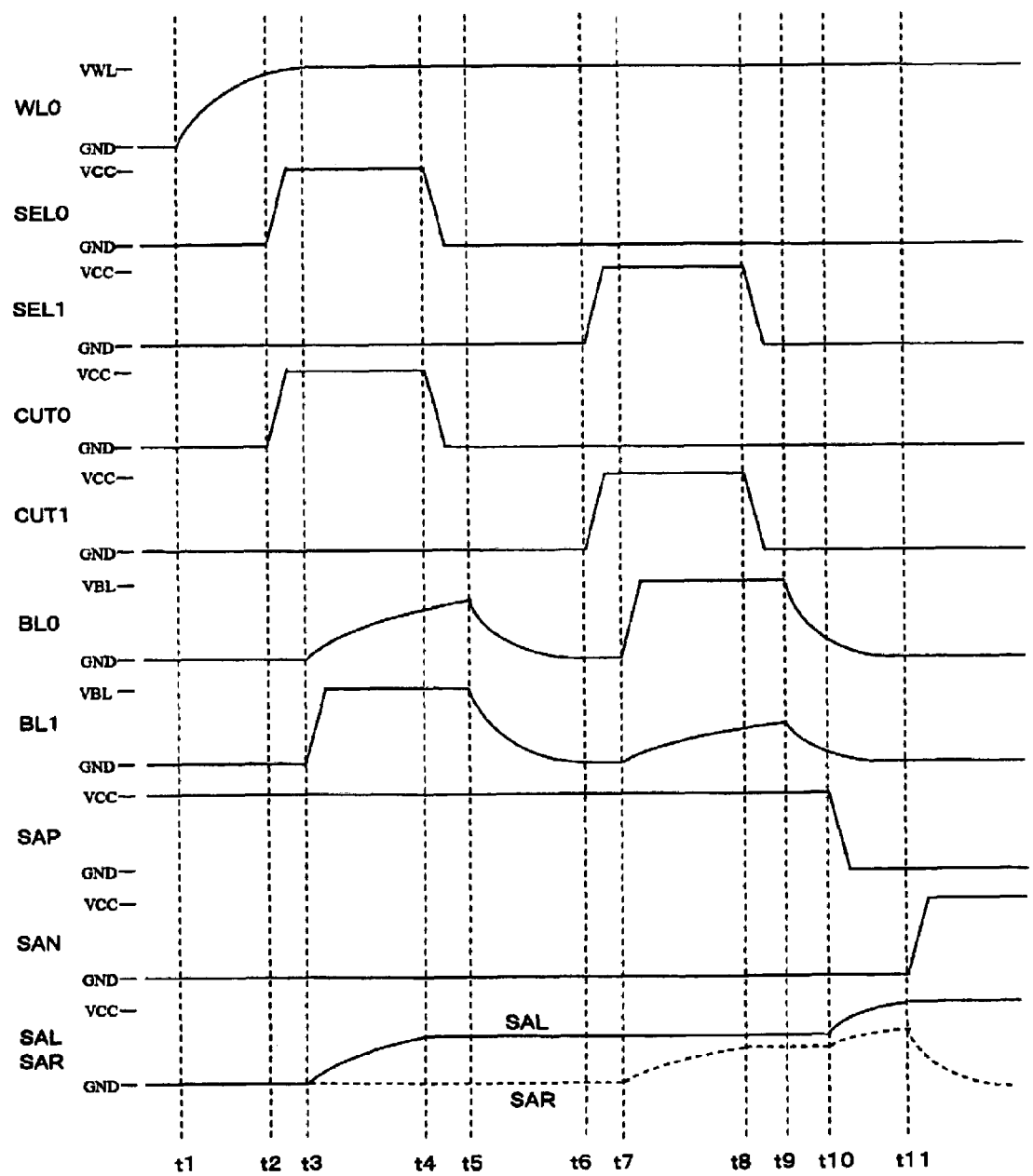
FIG. 21 is a timing chart showing read operation in the fifth embodiment.

FIG. 21 is a timing chart explaining the read operation of the semiconductor storage device in the fifth embodiment. Signal names in FIG. 21 correspond to the signal names given to the signal lines in FIG. 19.

Description will be given of the case where a memory cell MC0 connected to a word line WL0 is read out.

First, at time t1, the signal WL0 is raised to smoothly change the potential of the word line WL0 from GND to VWL. Next, at time t2, a signal SEL0 and a signal CUT0 are raised. As a result, a bit line BL0 is connected to an input terminal SAL on the left hand-side of the sense amplifier 104. At time t3, a bit line charging and discharging circuit 101 sets the potential of the bit line BL0 at GND in the high impedance (Hiz) state and charges the bit line BL1 with VBL (e.g., 1.2 V). At time t4, the signal SEL0 and the signal CUT0 are made to fallen. The bit line BL0 is disconnected, so that a potential of the bit line BL0 at this point is retained as one example of the first output in the parasitic capacitor Cs in an input terminal SAL on the left-hand side of the sense amplifier 104. At time t5, the potentials of the bit line BL0 and the bit line BL1 are discharged to GND, and at time t6, a signal SEL1 and a signal CUT1 are raised. As a result, the bit line BL1 is connected to an input terminal SAR on the right-hand side of the sense amplifier 104. At time t7, the bit line charging and discharging circuit 101 set the potential of the bit line BL1 at GND in the high impedance (Hiz) state, and charges the bit line BL0 with VBL (e.g., 1.2 V). At time t8, the signal SEL1 and the signal CUT1 are made to fallen. The bit line BL1 is disconnected, so that a potential of the bit line BL1 at this point as one example of the second output is retained in the parasitic capacitor Cs on the input terminal SAR on the right-hand side of the sense amplifier 104. At time t9, the potentials of the bit line BL0 and the bit line BL1 are discharged to GND. Thus, a voltage (potential) inputted into each input terminal of the sense amplifier is decided. After that, a signal SAP is raised at time t10 and a signal SAN is raised at time t11 so as to operate the sense amplifier.

According to the result shown in FIG. 21, the potential of the input terminal SAL upon disconnection of the bit line BL0 is higher than the potential of the input terminal SAR upon disconnection of the bit line BL1, and so the signal SAL is set High while the signal SAR is set Low, by which the output of the sense amplifier after amplification becomes data 1.

In the present invention as shown in this embodiment, the memory cell compares a right-reading cell current and a left-reading cell current of its own, which eliminates the necessity of the reference voltage for determining data 0 and data 1, more specifically, eliminates the necessity of a single reference voltage and the like as a determination criterion for all the memory cells connected to one word line. Further in the present invention, in addition to the unnecessity of the reference voltage, correct data readout can be achieved even when the distributions of cell current values of data 0 and data 1 overlap as shown in FIG. 20.

Although the sidewall memory having a cross sectional structure shown in FIG. 2 is used in the semiconductor storage device in the fifth embodiment, the semiconductor storage device in the present invention can use memory cells having any structure as long as the memory cells have two storage nodes (storage layers or storage sections) on both the sides of a channel region. For example, the memory structures shown in FIGS. 13 to 17 can be used.

@Although the parasitic capacitances of the capacitor parasitic in each input terminal of the sense amplifier are used as capacitors necessary for inputting potential signals into two input terminals of the sense amplifier 104 in the semiconductor storage device in the fifth embodiment, it is also possible to provide capacitors outside the sense amplifier. In such a case, the capacity can be enlarged, which makes it possible to increase a noise margin (noise resistance) for various noises generated during a time difference between the first output readout and the second output readout (time t5 to time t9 in FIG. 21).

Sixth Embodiment

Figure 22:
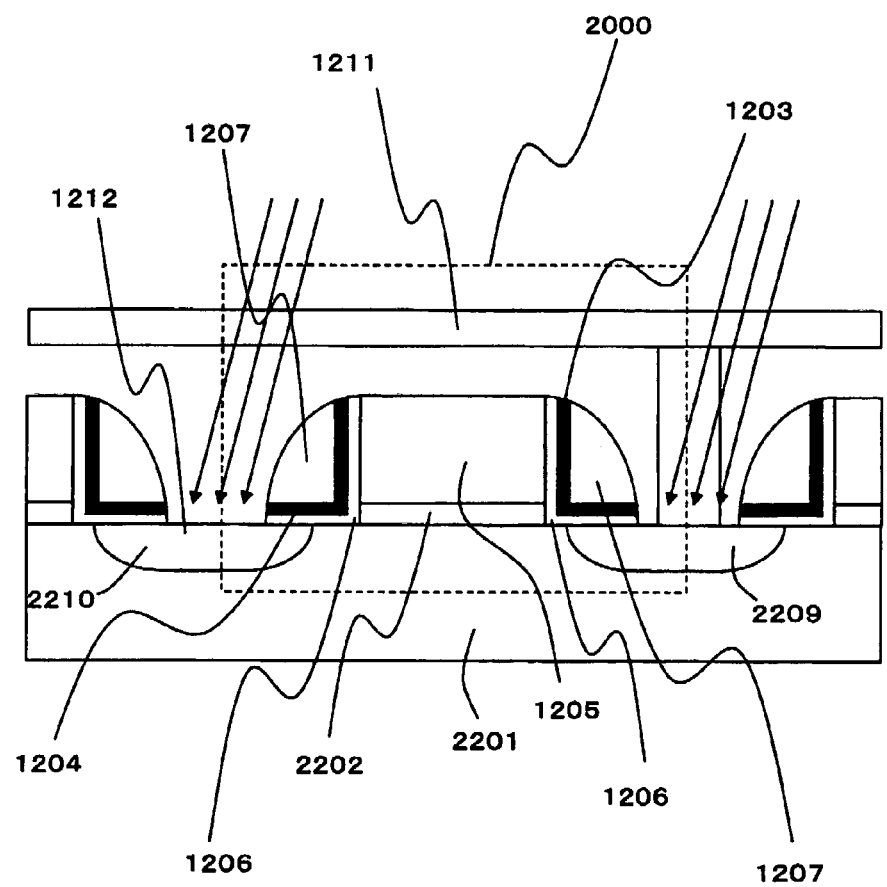
FIG. 22 is a cross sectional view of a sidewall memory used for a semiconductor storage device in a sixth embodiment of the present invention.

FIG. 22 is a cross sectional view showing a memory cell for use in a sixth embodiment of the present invention. The sixth embodiment is different from the embodiment shown in FIG. 2 in the point that in forming a diffusion layers 2209 and 2210, ions are injected obliquely (off the vertical direction) to a substrate 2201 so that distances (offset amounts) from the ends of the respective diffusion layers 2209, 2210 to a gate insulating film 2202 are asymmetric with respect to a memory cell 2000.

In the case where the offset amount on the right-hand side is smaller than the offset amount on the left hand-side as shown in FIG. 22, a current passed from the left hand-side to the right-hand side becomes larger than a current passed from the right-hand side to the left hand-side even if both the storage nodes (first and second silicon nitrides 1203, 1204) are in the erased state. This corresponds to the state in the first embodiment in which the right-hand side storage node (first silicon nitride 1203) is put in the write state and the left hand-side storage node (second silicon nitride 1204) is put in the erased state.

When programming is made to the left hand-side storage node (second silicon nitride 1204), a current passed from the right-hand side to the left hand-side can be made larger than a current passed from the left hand-side to the right-hand side contrary to the previous case. This corresponds to the state in the first embodiment in which the right-hand side storage node (first silicon nitride 1203) is put in the erased state and the left hand-side storage node (second silicon nitride 1204) is put in the write state.

In the sixth embodiment, exactly the same readout method of the fifth embodiment can be used. Thus, even with both the storage nodes being in the erased state, making the magnitude of the cell currents asymmetric allows additional write operation per bit in application of the semiconductor storage device to flash memories and the like which can be erased only per block.

Seventh Embodiment

Figure 23:
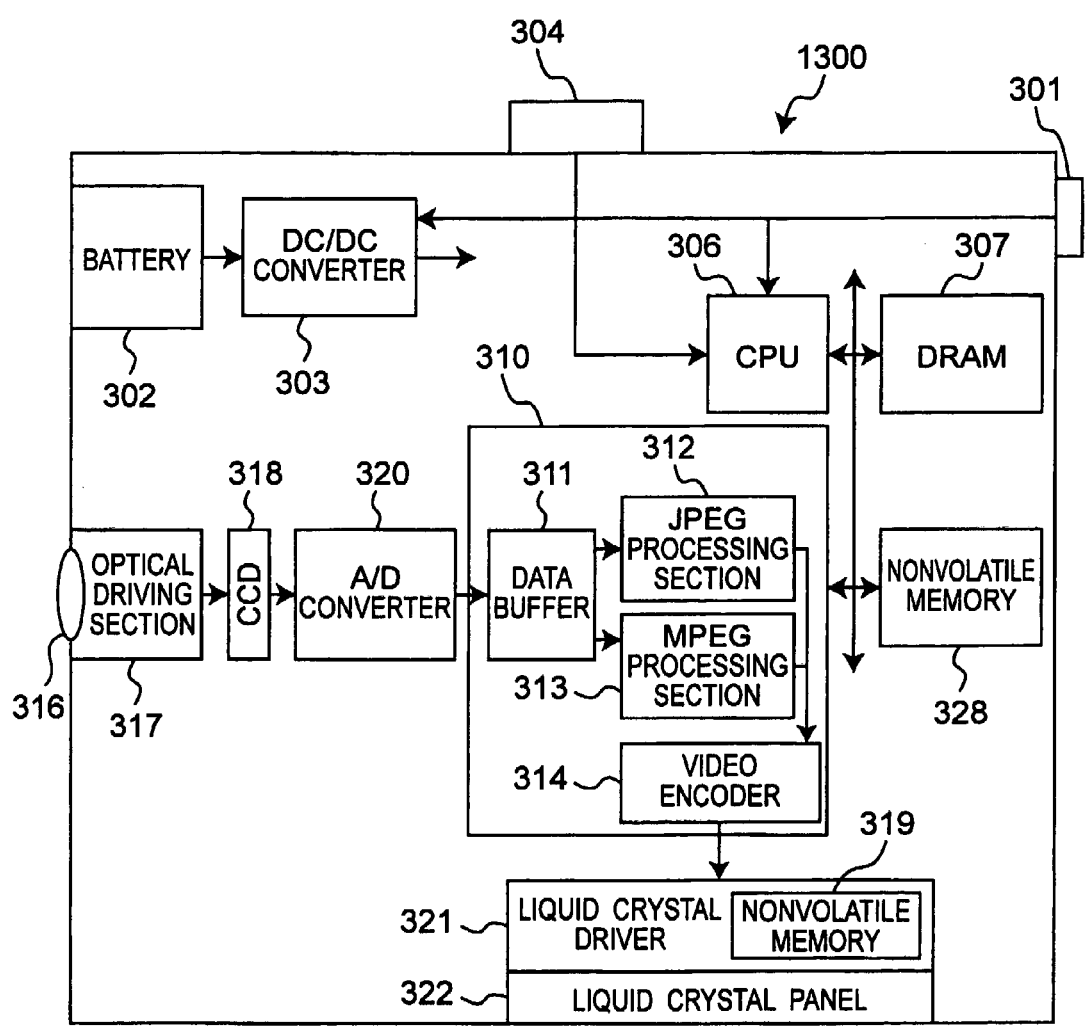
FIG. 23 is a block diagram of a digital camera as one example of electronic equipment in a seventh embodiment of the present invention.

FIG. 23 is a block diagram showing a digital camera 1300 as one embodiment of electronic equipment in the present invention. In FIG. 23, component members identical to those of the digital camera 300 in FIG. 18 are designated by identical reference numerals used in FIG. 18.

The digital camera 1300 has nonvolatile memories 328, 319 as the semiconductor storage devices according to the fifth and the sixth embodiments or the modified examples thereof. The nonvolatile memory 328 is used for storing photographed images, while the nonvolatile memory 319 is incorporated in a liquid crystal driver 321 and used for storing dispersion correction values for a liquid crystal panel 322.

In the digital camera 1300 as with the digital camera 300 in FIG. 18, once a power switch 301 is turned on by an operator, electric power supplied from a battery 302 is transformed to a specified voltage in a DC/DC converter 303 and is supplied to each component. Light coming from a lens 316 is converted to a current in a CCD 318 and then is converted to a digital signal in an analog-digital converter 320 before being inputted into a data buffer 311 in an image processing section 310. The signal inputted into the data buffer 311 is subjected to motion picture processing in an MPEG processing section 313 and travels to a video encoder 314 to be a video signal before being displayed on the liquid crystal panel 322 via the liquid crystal driver 321. In this case, the liquid crystal driver 321 corrects the dispersion of the liquid crystal panel 322 (e.g., tone dispersion among liquid crystal panels) with use of the data in the incorporated nonvolatile memory 319. Once a shutter 304 is pressed by an operator, the information in the data buffer 311 is processed as a static image in a JPEG processing section 312 and then is stored in the flash memory 328 that is a nonvolatile memory. The nonvolatile memory 328 stores photographed image information as well as system programs and the like. A DRAM 307 is used for temporary storage of data generated during various processing steps in a CPU 306 and the image processing section 310.

The nonvolatile memories 328, 319 of the digital camera need to increase the reliability of data which is stored for a long time. The nonvolatile memories 328, 319 correctly read the information in memory cells by comparing the current values in left and right two directions even when an interval between distributions of cell current values of data 0 and data 1 are extremely narrowed or the distributions are overlapped. Therefore, the digital camera having the nonvolatile memories 328, 319 can achieve cost reduction, downsizing and high reliability.

Although the semiconductor storage device in the present invention is mounted on the digital camera in the fourth and seventh embodiments, the semiconductor storage device of the present invention is preferably mounted on portable phones. Since flash memories for use in the portable phones record image data as well as communication protocols, they need high reliability. Therefore, mounting the semiconductor storage device of the present invention on the portable phones makes it possible to drastically increase the quality of the portable phones. It should naturally be understood that the semiconductor storage device of the present invention can be mounted on electronic equipment other than digital cameras and portable phones such as digital voice recorders, DVD devices, color control circuits for liquid display devices, music recording and reproducing devices, imaging devices, audio devices and copying machines.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device, comprising:
    a memory cell array composed of a plurality of arrayed memory cells, each memory cell having a first storage region capable of storing information in vicinity of one of opposite ends of a channel region, a second storage region capable of storing information in vicinity of the other end of the channel region, a first input/output terminal, a second input/output terminal, and a control terminal;
    word lines connected to the control terminals of the memory cells;

bit lines connected to the first input/output terminals and/or the second input/output terminals of the memory cells;

a bit line charging and discharging circuit for charging or discharging the bit lines; and a readout section for reading information stored in the first storage region of a memory cell based on a first output equivalent to an output current from the memory cell when a current is passed from the first input/output terminal to the second input/output terminal of the memory cell and a second output equivalent to an output current from the memory cell when a current is passed from the second input/output terminal to the first input/output terminal.

2. The semiconductor storage device as set forth in claim 1, wherein the readout section includes:

a first sense amplifier for comparing the first output with a first reference value which can distinguishes between a state in which data 1 is stored in the first storage region while data 1 is stored in the second storage region and a state in which data 0 is stored in the first storage region while data 1 is stored in the second storage region;

a second sense amplifier for comparing the first output with a second reference value which can distinguish between a state in which data 1 is stored in the first storage region while data 0 is stored in the second storage region and a state in which data 0 is stored in the first storage region while data 0 is stored in the second storage region;

a third sense amplifier for comparing the first output with the second output; and a majority logic circuit connected to an output terminal of the first sense amplifier, an output terminal of the second sense amplifier and an output terminal of the third sense amplifier.

3. The semiconductor storage device as set forth in claim 1, wherein the first output is a potential of the bit line connected to the first input/output terminal, and the second output is a potential of the bit line connected to the second input/output terminal, and the semiconductor storage device further includes:

a first capacitor for storing electric charge equivalent to a potential difference between the first output and a first reference potential, the first capacitor having two electrodes;

a second capacitor for storing electric charge equivalent to a potential difference between the first output and the second output, the second capacitor having two electrodes;

a switching section for connecting and disconnecting a first reference potential-side electrode of the first capacitor and a second output-side electrode of the second capacitor; and a sense amplifier for receiving a potential difference between the electrodes of the first capacitor or a potential difference between the electrodes of the second capacitor.

4. The semiconductor storage device as set forth in claim 1, wherein the first output is a potential of the bit line connected to the first input/output terminal, and the second output is a potential of the bit line connected to the second input/output terminal, and the semiconductor storage device further includes:

a first capacitor for storing electric charge equivalent to a potential difference between the first output and a first reference potential, the first capacitor having two electrodes;

a second capacitor for storing electric charge equivalent to a potential difference between the first output and a second reference potential, the second capacitor having two electrodes;

a third capacitor for storing electric charge equivalent to a potential difference between the first output and the second output, the third capacitor having two electrodes;

a switching section for connecting and disconnecting a first reference potential-side electrode of the first capacitor, a second reference potential-side electrode of the second capacitor, and a second output-side electrode of the third capacitor; and a sense amplifier for receiving a potential difference between the electrodes of the first capacitor, a potential difference between the electrodes of the second capacitor, or a potential difference between the electrodes of the third capacitor.

5. The semiconductor storage device as set forth in claim 1, wherein the first output is a potential of the bit line connected to the first input/output terminal, and the second output is a potential of the bit line connected to the second input/output terminal, and the semiconductor storage device includes:

a first capacitor for storing electric charge equivalent to a potential difference between the first output and a first reference potential;

a second capacitor for storing electric charge equivalent to a potential difference between the first output and a ground;

a third capacitor for storing electric charge equivalent to a potential difference between the second output and the ground;

a switching section for connecting and disconnecting a first reference potential-side electrode of the first capacitor and a counter ground-side electrode of the third capacitor; and a sense amplifier for comparing a potential at a counter ground-side electrode of the second capacitor and a potential at the counter ground-side electrode of the third capacitor.

6. The semiconductor storage device as set forth in claim 1, wherein the first output is a potential of the bit line connected to the first input/output terminal, and the second output is a potential of the bit line connected to the second input/output terminal, and the semiconductor storage device includes:

a first capacitor for storing electric charge equivalent to a potential difference between the first output and a first reference potential;

a second capacitor for storing electric charge equivalent to a potential difference between the first output and a second reference potential;

a third capacitor for storing electric charge equivalent to a potential difference between the first output and a ground;

a fourth capacitor for storing electric charge equivalent to a potential difference between the second output and the ground;

a switching section for connecting and disconnecting a first reference potential-side electrode of the first capacitor, a second reference potential-side electrode of the second capacitor and a counter ground-side electrode of the fourth capacitor; and a sense amplifier for comparing a potential at a counter ground-side electrode of the third capacitor and a potential at the counter ground-side electrode of the fourth capacitor.

7. The semiconductor storage device as set forth in claim 1, wherein the first output is a potential of the bit line connected to the first input/output terminal, and the second output is a potential of the bit line connected to the second input/output terminal, and the semiconductor storage device includes:

a first capacitor and a second capacitor; and a switching circuit for switching between connection and disconnection of the first capacitor and the second capacitor such that electric charge equivalent to a potential difference between the first output and a first reference potential is stored in the first capacitor, that electric charge equivalent to a potential difference between the first output and the second output is stored in the second capacitor, that the first capacitor and the second capacitor are connected in parallel, and that a potential difference corresponding to a sum of the electric charge equivalent to the potential difference between the first output and the first reference potential stored in the first capacitor and the charge equivalent to the potential difference between the first output and the second output stored in the second capacitor is outputted to a sense amplifier.

8. The semiconductor storage device as set forth in claim 1, wherein the first output is a potential of the bit line connected to the first input/output terminal, and the second output is a potential of the bit line connected to the second input/output terminal, and the semiconductor storage device includes:

a first capacitor, a second capacitor, and a third capacitor; and a switching circuit for switching between connection and disconnection of the first capacitor, the second capacitor and the third capacitor so that electric charge equivalent to a potential difference between the first output and a first reference potential is stored in the first capacitor, that electric charge equivalent to a potential difference between the first output and a second reference potential is stored in the second capacitor, that electric charge equivalent to a potential difference between the first output and the second putout is stored in the third capacitor, that the first capacitor, the second capacitor and the third capacitor are connected in parallel, and that a potential difference corresponding to a sum of the charge equivalent to the potential difference between the first output and the first reference potential stored in the first capacitor, the charge equivalent to the potential difference between the first output and the second reference potential stored in the second capacitor and the charge equivalent to the potential difference between the first output and the second putout stored in the third capacitor is outputted to a sense amplifier.

9. The semiconductor storage device as set forth in claim 1, the first output is a potential of the bit line connected to the first input/output terminal, and the second output is a potential of the bit line connected to the second input/output terminal, and the semiconductor storage device includes:

a first capacitor, a second capacitor, a third capacitor; and a switching circuit for switching between connection and disconnection of the first capacitor, the second capacitor and the third capacitor so that electric charge equivalent to a potential difference between the first output and a first reference potential is stored in the first capacitor, that electric charge equivalent to a potential difference between the first output and a ground is stored in the second capacitor, that electric charge equivalent to a potential difference between the second output and the ground is stored in the third capacitor, that the first capacitor, the second capacitor and the third capacitor are connected in parallel, and that a potential difference corresponding to a sum of the charge equivalent to the potential difference between the first output and the first reference potential stored in the first capacitor, the charge equivalent to the potential difference between the first output and the ground stored in the second capacitor and the charge equivalent to the potential difference between the second output and the ground stored in the third capacitor is outputted to a sense amplifier.

10. The semiconductor storage device as set forth in claim 1, wherein the first output is a potential of the bit line connected to the first input/output terminal, and the second output is a potential of the bit line connected to the second input/output terminal, and the semiconductor storage device includes:

a first capacitor, a second capacitor, a third capacitor, and a fourth capacitor; and a switching circuit for switching between connection and disconnection of the first capacitor, the second capacitor, the third capacitor and the fourth capacitor so that electric charge equivalent to a potential difference between the first output and a first reference potential is stored in the first capacitor, that electric charge equivalent to a potential difference between the first output and a second reference potential is stored in the second capacitor, that electric charge equivalent to a potential difference between the first output and a ground is stored in the third capacitor, that electric charge equivalent to a potential difference between the second output and the ground is stored in the fourth capacitor, that the first capacitor, the second capacitor, the third capacitor and the fourth capacitor are connected in parallel, and that a potential difference corresponding to a sum of the charge equivalent to the potential difference between the first output and the first reference potential stored in the first capacitor, the charge equivalent to the potential difference between the first output and the second reference potential stored in the second capacitor, the charge equivalent to the potential difference between the first output and the ground stored in the third capacitor, and the charge equivalent to the potential difference between the second output and the ground stored in the fourth capacitor is outputted to a sense amplifier.

11. The semiconductor storage device as set forth in claim 1, wherein the memory cells are sidewall memory cells.

12. Electronic equipment, comprising the semiconductor storage device as set forth in claim 1.

13. A semiconductor storage device, comprising:

a memory cell array composed of a plurality of arrayed memory cells, each memory cell having a first storage region capable of storing information in vicinity of one of opposite ends of a channel region, a second storage region capable of storing information in vicinity of the other end of the channel region, a first input/output terminal provided on the one end side of the channel region, and a second input/output terminal provided on the other end side of the channel region, each of the memory cells storing 1-bit information by taking a first state or a second state which are distinguished from each other, the first state being a state in which a current flowing from the first input/output terminal to the second input/output terminal is larger than a current flowing from the second input/output terminal to the first input/output terminal, while the second state being a state in which current flowing from the second input/output terminal to the first input/output terminal is larger than a current flowing from the first input/output terminal to the second input/output terminal; and a readout section for reading information stored in a memory cell by comparing a first output corresponding to an output current from the memory cell when a current is passed from the first input/output terminal to the second input/output terminal of the memory cell with a second output corresponding to an output current from the memory cell when a current is passed from the second input/output terminal to the first input/output terminal.

14. The semiconductor storage device as set forth in claim 13, wherein the first state is a state in which the first storage region is in a programmed state while the second storage region is in an erased state, whereas the second state is a state in which the first storage region is in the erased state while the second storage region is in the programmed state.

15. The semiconductor storage device as set forth in claim 13, wherein the memory cell has an asymmetric characteristic so that with both the first storage region and the second storage region in an erased state, a current flowing from the first input/output terminal to the second input/output terminal is larger than a current flowing from the second input/output terminal to the first input/output terminal, and the first state is a state in which the first storage region and the second storage region are in the erased state, and the second state is a state in which the first storage region is in a programmed state while the second region is in the erased state.

16. The semiconductor storage device as set forth in claim 13, further comprising:

bit lines connected to the first input/output terminals and/or the second input/output terminals of the memory cells; and a bit line charging and discharging circuit for charging or discharging the bit lines, wherein the first output is a potential of the bit line connected to the first input/output terminal, and the second output is a potential of the bit line connected to the second input/output terminal, and wherein the readout section comprises a sense amplifier for comparing the first output with the second output.

17. The semiconductor storage device as set forth in claim 16, further comprising:

a first capacitor for storing electric charge equivalent to a potential difference between the first output and a ground; and a second capacitor for storing electric charge equivalent to a potential difference between the second output and the ground, wherein a potential difference between a potential of the first capacitor at a side opposite from the ground and a potential of the second capacitor at a side opposite from the ground is inputted into the sense amplifier.

18. The semiconductor storage device as set forth in claim 13, wherein the memory cells are sidewall memories.

19. Electronic equipment, comprising the semiconductor storage device as set forth in claim 13.

* * * * *